United States Patent
Kim et al.

(10) Patent No.: US 12,111,786 B2
(45) Date of Patent: Oct. 8, 2024

(54) ACTIVE INDUCTOR BASED HIGH-BANDWIDTH 2-STATE 4-WAY DATA SERIALIZATION APPARATUS AND METHOD

(71) Applicant: Intel Corporation, Santa Clara, CA (US)

(72) Inventors: Jihwan Kim, Portland, OR (US); Ajay Balankutty, Hillsboro, OR (US); Sandipan Kundu, Hillsboro, OR (US); Stephen Kim, Beaverton, OR (US); Frank O'Mahony, Portland, OR (US); Kai Yu, Portland, OR (US); Bong Chan Kim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 489 days.

(21) Appl. No.: 17/338,512

(22) Filed: Jun. 3, 2021

(65) Prior Publication Data
US 2022/0147482 A1   May 12, 2022

Related U.S. Application Data

(60) Provisional application No. 63/111,511, filed on Nov. 9, 2020.

(51) Int. Cl.
  *G06F 13/42* (2006.01)
  *G06F 1/06* (2006.01)
  (Continued)

(52) U.S. Cl.
  CPC ......... *G06F 13/4291* (2013.01); *G06F 1/06* (2013.01); *G06F 1/10* (2013.01); *H03K 17/6872* (2013.01); *H03K 17/6874* (2013.01); *H03L 7/00* (2013.01)

(58) Field of Classification Search
  CPC ......... G06F 13/4291; G06F 1/06; G06F 1/10; H03K 17/6872; H03K 17/6874; H03L 7/00
  See application file for complete search history.

(56) References Cited

U.S. PATENT DOCUMENTS

| | | | | |
|---|---|---|---|---|
| 6,316,979 | B1 * | 11/2001 | Keeth | H03K 5/1515 327/258 |
| 2017/0364801 | A1 * | 12/2017 | Kim | G06N 3/065 |

FOREIGN PATENT DOCUMENTS

| | | | | |
|---|---|---|---|---|
| EP | 3073640 | A1 * | 9/2016 | H03B 5/1209 |

OTHER PUBLICATIONS

Casper, et al., "Clocking Analysis, Implementation and Measurement Techniques for High-Speed Data Links—A Tutorial", IEEE Transactions on Circuits and Systems I: Regular Papers, vol. 56, No. 1, pp. 17-39, Jan. 2009, doi: 10.1109/TCSI.2008.931647.

(Continued)

*Primary Examiner* — Joseph J Lauture
(74) *Attorney, Agent, or Firm* — NICHOLSON DE VOS WEBSTER & ELLIOTT LLP

(57) ABSTRACT

An apparatus enables a high-bandwidth 4-way data serializing (4:1 serializer) digital-to-analog converter. The apparatus uses active inductor-based bandwidth extension technique for two-stage driver enabling design of quarter-rate 4-way data serializing transmitter. The 4:1 serializer output bandwidth is extended by gate-resistor-peaked n-type transistor load working as an active inductor. A current steering switch with current source is used as the final driver. The 4:1 serializer includes a pulse width tuning technique with tunable ground voltage on the ground terminal of a pulse generator to tune an effective threshold voltage of the pulse generator. A Bessel-like LC filter is coupled to an output of the 4:1 serializer. The filter includes shunt peaking paths that provide zeros, which natively cancel large parasitic capaci- (Continued)

tance at a shunt peaking node. As such, active and passive devices including driver circuitry, ESD diodes, and any other sensing circuitry are flexibly added on any LC filter nodes.

19 Claims, 18 Drawing Sheets

(51) Int. Cl.
*G06F 1/10* (2006.01)
*H03K 17/687* (2006.01)
*H03L 7/00* (2006.01)

(56) References Cited

OTHER PUBLICATIONS

Chen, Ming-Shuan et al., "A 50-64 GB/s Serializing Transmitter With a 4-Tap, LC-Ladder-Filter-Based FFE in 65 nm CMOS Technology", IEEE Journal of Solid-State Circuits, vol. 50, No. 8, Aug. 2015, 14 pgs.
Toprak-Deniz, Zeynep et al., "A 128-GB/s 1.3-pJ/b PAM-4 Transmitter With Reconfigurable 3-Tap FFE in 14-nm CMOS", IEEE Journal of Solid-State Circuits, vol. 55, No. 1, Jan. 2020, 8 pgs.

\* cited by examiner

230

240

600
(e.g., 1-UI pulse generator 103-a0)

ACTIVE INDUCTOR BASED HIGH-BANDWIDTH 2-STATE 4-WAY DATA SERIALIZATION APPARATUS AND METHOD

CLAIM OF PRIORITY

This application claims priority to U.S. Provisional Application Ser. No. 63/111,511, filed on Nov. 9, 2020 and titled "ACTIVE INDUCTOR BASED HIGH-BANDWIDTH 2-STATE 4-WAY DATA SERIALIZATION," which is incorporated by reference in its entirety.

BACKGROUND

As the required per-pin data-rate of serial input-output (IO) keeps increasing exponentially (e.g., approximately 2× per 3 years) and now exceeds 32 Gbaud for networking standards, using a quarter-rate clocking architecture for a transmitter (TX) is a common way to reduce overall power consumption and achieve good jitter performance. At the same time, capability of supporting flexible feed-forward equalization (FFE) in the TX is desired in many long-reach serial links such as those at data-rates of 112 Gb/s or higher to effectively cancel out long-tail channel inter-symbol interference (ISI) and reflection. As such, time-interleaved 4-way data serializing digital-to-analog converter (DAC) using 1-UI (one-unit interval) pulse generator has become a popular architecture choice for ultra-high speed serializer-deserializer (SerDes) applications at greater than 112 Gb/s per-pin data-rate.

One challenge for designing the time-interleaved 4-way data serializing DAC with quarter-rate clocking is to achieve high enough bandwidth at the output of the final data serialization (e.g., output of a 4:1 multiplexer, wherein the multiplexer inputs are 1-UI pulse generators), while maintaining static and dynamic linearity at the DAC output.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
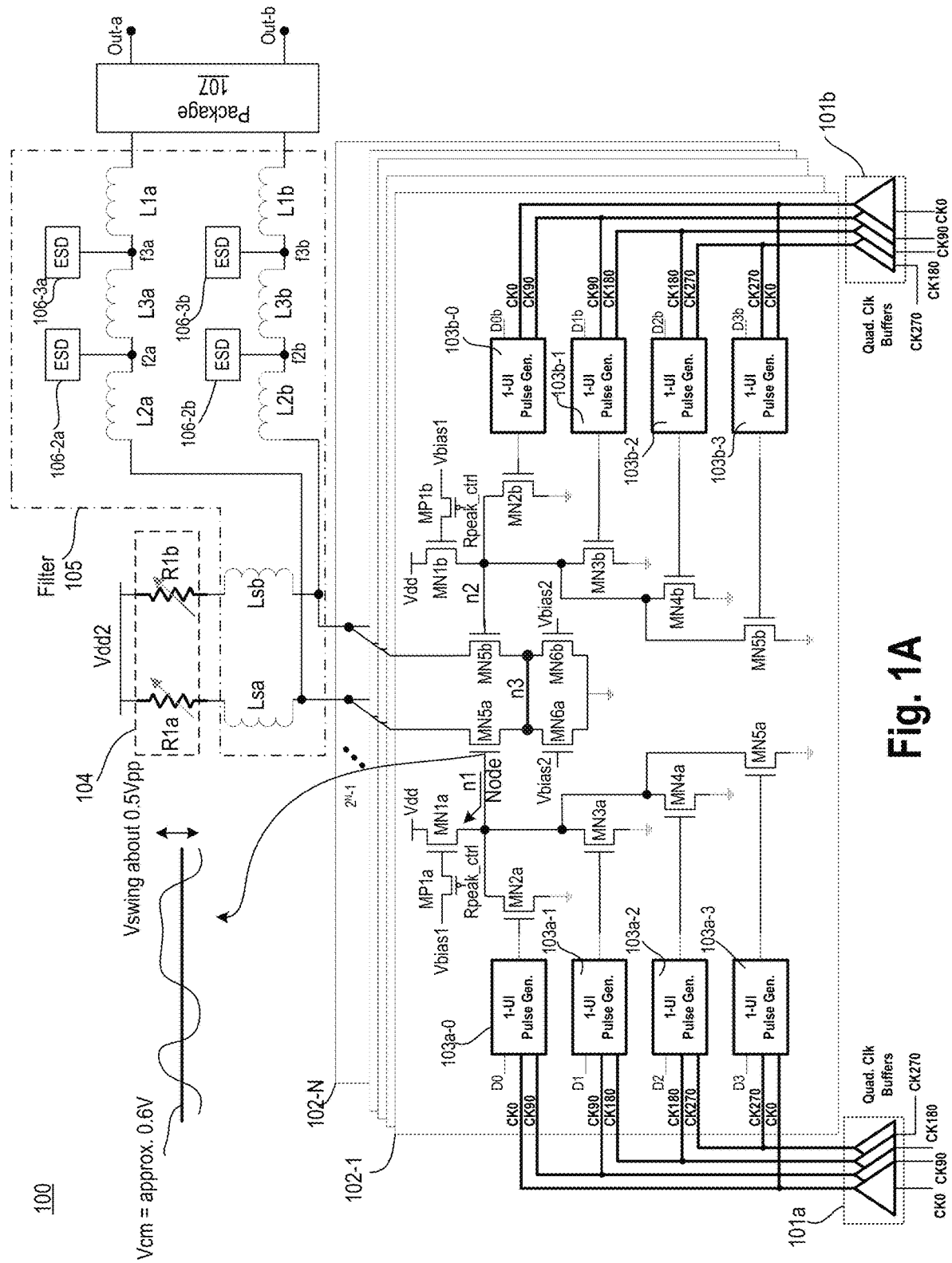
FIG. 1A illustrates an apparatus comprising differential time-interleaved 4-way data serializing transmitter front-end using active inductor with gate-resistor peaked n-type load in a serializer, in accordance with some embodiments.

One way of extending output bandwidth of a TX having serializing data DAC is using passive inductors to tune out parasitic capacitance. These passive inductors are placed at the output of the serializing data DAC. A 4-way serializing data DAC comprises four 1-UI pulse generators and a 4:1 multiplexer. The inputs of the multiplexer are the outputs of the four 1-UI pulse generators. Each pulse generator receives a data input and two phases of a clock. For example, the first pulse generator receives data D0, clock CK0, clock CK90, the second pulse generator receives data D1, clock CK90, clock CK180, the third pulse generator receives data D2, clock CK180, clock CK270, and the fourth pulse generator receives data D3, clock CK270, clock CK0. Here, CK0, CK90, CK180, and CK270 are clocks with phases separated or shifted by 0 degree, 90 degree, 180 degree, and 270 degree respectively. The output of the multiplexer, which is used as a driver, is coupled to a shunt peaking inductor.

The shunt peaking inductor is coupled to the output of the multiplexer and a power supply rail via a programmable termination resistor coupled in series to the shunt peaking inductor. Passive inductors can also be added in series to the output of the multiplexer to the package pin for bandwidth extension. However, this design with serializing multiplexer (MUX) performing as the output driver, which uses passive inductors to tune out parasitic capacitance, is not able to extend the bandwidth effectively at data-rate of 224 G-PAM4 (pulse amplitude modulation) if it is solely applied to conventional 4:1 MUX based TX driver. To get acceptable gain-bandwidth with minimal phase distortion up to Nyquist frequency of 56 GHz, extremely small (not physically possible to implement in silicon) inductors with reasonably high quality-factor (Q) are needed to implement the pad network to cancel out large capacitance caused from the high-speed 4:1 multiplexer. To achieve acceptable bandwidth extension, output driver must exhibit small enough parasitic capacitance. Here, the 4:1 multiplexer wastes three-fourth of the output capacitance (i.e., three pulse generators are idle when one pulse generator is functioning).

Some embodiments describe an apparatus that enables a two-stage output stage comprising of a high-bandwidth 4-way data serializing DAC and a dedicated output driver. The apparatus uses an active inductor-based bandwidth extension technique at a first stage output enabling design of high-bandwidth quarter-rate 4-way data serializing transmitter. In some embodiments, the 4:1 serializer output bandwidth is extended by gate-resistor-peaked n-type transistor load working as an active inductor. In some embodiments, a current steering switch with current source is used as the final driver.

In some embodiments, the apparatus comprises: a pulse generator and a first transistor coupled to the pulse generator, wherein an output of the pulse generator controls a gate terminal of the first transistor. In some embodiments, the apparatus comprises a second transistor coupled is series with the first transistor via a node, wherein a gate terminal of the second transistor is controllable by a resistive device. In some embodiments, the pulse generator receives a data input, a first clock and a second clock, wherein the first clock is phase shifted relative to the second clock by substantially 90 degrees. In some embodiments, a ground node of the pulse generator is tunable via a circuitry.

In some embodiments, the circuitry comprises a controller to compare a voltage on the ground node with a reference voltage to generate a digital code; a plurality of switches controllable by the digital code; and a capacitor coupled to the ground node. In some embodiments, the apparatus comprises a third transistor having a gate terminal coupled to the node. In some embodiments, the apparatus comprises a fourth transistor coupled is series with the third transistor, wherein the fourth transistor is controllable by a bias. In some embodiments, the apparatus comprises a shunt inductor coupled to the third transistor, wherein the shunt inductor is coupled to a supply rail via a resistor. In some embodiments, the apparatus comprises a distributed network of inductors and electrostatic discharge circuitries (ESDs), wherein one end of the distributed network is coupled to the third transistor while another end of the distributed network is coupled to a package. In some embodiments, the resistive device comprises a transistor coupled to the gate of the second transistor, wherein the resistive device receives a bias voltage.

There are many technical effects of various embodiments. For example, the final driver may transmit 112 Gbaud data without severe amplitude and phase distortion to the package output. In one instance, without passive inductors inside the DAC, the DAC can be implemented in small area (e.g., 35 μm×55 μm) area while achieving extremely high output data-rate of 224 Gb/s (Phase Amplitude Modulation 4-level (PAM-4)) with good linearity performance. Power consumption in one example is merely 70 mW. As such, the apparatus enables a serial-deserializer (SerDes) for mega-data centers, 5G base stations, and supercomputers. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1A illustrates apparatus 100 comprising differential time-interleaved 4-way data serializing transmitter front-end using active inductor with gate-resistor peaked n-type load in a serializer, according to some embodiment. Apparatus 100 comprises a first set of quadrature clock buffers 101a, a second set of quadrature (Quad) clock (Clk) buffers 101b, N differential time-interleaved 4-way data serializing transmitter front-end circuits 102-1 through 102-N, programmable register set 104, and filter 105. Filter 105 is coupled to package 107, which provides the outputs Out-a and Out-b.

In some embodiments, each of the N differential time-interleaved 4-way data serializing transmitter front-end circuits 102-1 through 102-N comprise a first set of four 1-UI pulse generators 103a-0, 103a-1, 103a-2, and 103a-3. Circuits 102-1 through 102-N comprise a second set of four 1-UI pulse generators 103b-0, 103b-1, 103b-2, and 103b-3. In various embodiments, first and second sets of Quad Clk buffers provides quadrature clocks CK0, CK90, CK180, and CK270, where clock CK90 is 90 degrees out of phase relative to clock CK0, clock CK180 is 180 degrees out of phase relative to clock CK0, and clock CK270 is 270 degrees out of phase relative to clock CK0. In various embodiments, programmable register set 104 comprises a first programmable resistor R1a, and a second programmable resistor R1b.

In some embodiments, filter 105 includes a first inductor Lsa, a second inductor Lsb, and a pair of distributed inductor and electrostatic discharge circuits (ESDs). In some embodiments, the first inductor Lsa has a first terminal coupled to the outputs of circuits 102-1 through 102-N and a second terminal coupled the first programmable resistor R1a, which is coupled to a supply rail Vdd2. In some embodiments, the second inductor Lsa has a first terminal coupled to the outputs of circuits 102-1 through 102-N and a second terminal coupled the second programmable resistor R1b, which is coupled to the supply rail Vdd2. In this example, filter 105 is shown with two signal paths—a first path and a second path. The first path includes inductors L1a, L2a, and L3a and ESDs 106-2a and 106-3a coupled to nodes f2a and f3a as shown. The second path is a mirror image of the first path. The second path includes inductors L1b, L2b, and L3b and ESDs 106-2b and 106-3b coupled to nodes f2b and f3b as shown.

In some embodiments, the first set of four 1-UI pulse generators includes a first pulse generator 103a-0 that receives digital data D0 and clocks CK0 and CK90. In some embodiments, the first set of four 1-UI pulse generators includes a second pulse generator 103a-1 that receives digital data D1 and clocks CK90 and CK180. In some embodiments, the first set of four 1-UI pulse generators includes a third pulse generator 103a-2 that receives digital data D2 and clocks CK180 and CK270. In some embodiments, the first set of four 1-UI pulse generators includes a fourth pulse generator 103a-3 that receives digital data D3 and clocks CK270 and CK0. In some embodiments, the second set of four 1-UI pulse generators includes a first pulse generator 103b-0 that receives digital data D0b (inverse of D0) and clocks CK0 and CK90. In some embodiments, the second set of four 1-UI pulse generators includes a second pulse generator 103b-1 that receives digital data D1b (inverse of D1) and clocks CK90 and CK180. In some embodiments, the second set of four 1-UI pulse generators includes a third pulse generator 103b-2 that receives digital data D2b (inverse of D2) and clocks CK180 and CK270. In some embodiments, the second set of four 1-UI pulse generators includes a fourth pulse generator 103b-3 that receives digital data D3b (inverse of D3) and clocks CK270 and CK0. Here, CK0 is the baseline clock with 0 phase, CK90 is a clock which is 90 degrees phase shifted relative to CK0, CK180 is a clock which is 180 degrees phase shifted relative to CK0, and where CK270 is a clock which is 270 degrees phase shifted relative to CK0.

In some embodiments, the first stage of first two stage circuit includes cascode n-type transistor MN1a coupled to n-type switches MN2a, MN3a, MN4a, and MN5a via node n1. The outputs of respective first, second, third, and fourth pulse generators (103a-0, 103a-1, 103a-2, and 103a-3, respectively) of the first set of four pulse generators are coupled to respective gate terminals of the n-type switches MN2a, MN3a, MN4a, and MN5a as shown. In various embodiments, the gate of transistor MN1a is coupled to transistor MP1a, which controllably provides Vbias1 to the gate of transistor MN1a. Transistor MP1a is controlled by Rpeak_ctrl. In various embodiments, Rpeak_ctrl is a gate bias voltage, which can be analog voltage generated using any suitable source (e.g., bandgap reference, voltage divider). Any suitable circuit can be used for generating Vbias1. For example, Vbias1 can be generated by a bandgap circuit, voltage divider, resistor divider, etc. Vbias1 can be generated on-die, on-package, or off-die (off-package).

In some embodiments, the n-type switches MN2a, MN3a, MN4a, and MN5a are coupled to the cascode device MN1a via node n1. In some embodiments, the second stage of the first two stage circuit comprises transistor MN5a and MN6a. In some embodiments, node n1 is coupled to driver MN5a which is coupled in series with transistor MN6a, where transistor MP6a is biased by Vbias2. Any suitable circuit can be used for generating Vbias2. For example, Vbias2 can be generated by a bandgap circuit, voltage divider, resistor divider, etc. Vbias1 can be generated on-die, on-package, or off-die (off-package).

In some embodiments, the second two stage circuit includes cascode n-type transistor MN1b coupled to n-type switches MN2b, MN3b, MN4b, and MN5b via node n2. The outputs of respective first, second, third, and fourth pulse generators (103b-0, 103b-1, 103b-2, and 103b-3, respectively) of the first set of four pulse generators are coupled to respective gate terminals of the n-type switches MN2b, MN3b, MN4b, and MN5b as shown. In various embodiments, the gate of MN1b is coupled to transistor MP1b, which controllably provides Vbias1 to the gate of MN1b. Transistor MP1b is controlled by Rpeak_ctrl. In some embodiments, n-type switches MN2b, MN3b, MN4b, and MN5b are coupled to the cascode device MN1b via node n2. In some embodiments, the second stage of the second two stage circuit comprises transistors MN5b and MN6b. In some embodiments, node n2 is coupled to driver MN5b which is coupled in series with transistor MN6b, where transistor MP6b is biased by Vbias2. Vbias1 and Vbais2 can be generated by any suitable bias generator such as bandgap reference generator, resistor divider, etc. In some embodiments, first stage is coupled to the second stage via node n3. Node n3 is coupled to transistors MN6a, MN6b, MN5a, and MN5b as shown.

In some embodiments, MN5a is coupled to shunt inductor Lsa which is coupled to Vdd2 (power supply rail) via resistor R1a. In some embodiments, MN5b is coupled to shunt inductor Lsb which is coupled to Vdd2 via resistor R1b. In some embodiments, the pair of distributed inductors and ESD circuits include inductors L1a, L2a, and L3a coupled in series as shown. In some embodiments, the pair of distributed inductors and ESD circuits include inductors L1b, L2b, and L3b coupled in series as shown. The inductors here can be air core inductors, magnetic inductors, or a combination of them. The inductors can be on-die, on-package, off-package, and/or off-die. The resistors R1a and R1b can be discrete devices and/or transistors configured as resistors.

In various embodiments, transistors MN1a, MP1a, MN2a, MN3a, MN4a, MN5a, and MN6a form a first 4:1 driver while transistors MN1b, MP1b, MN2b, MN3b, MN4b, MN5b, and MN6b form a second 4:1 driver, which together with the first 4:1 driver from a differential 4:1 driver that drives filter 105. In this example, the time-interleaved 4-way data serializing two-stage TX is implemented in slices to configure 7-bit DAC. Output bandwidth of 4:1 serializer is extended by an active inductive load using NMOS transistors (MN1a and MN1b) having PMOS transistor MP1a and MP1b connected at the gates, respectively, to generate controlled resistance.

While the embodiments are illustrated with reference to 4-way data serializing transmitter front-end, the apparatus of various embodiments is applicable to N-way data serializing transmitter front-end, where 'N' is a number. Likewise, the apparatus is described with reference to 7-bit DAC, the apparatus is applicable to M-bit DAC, where 'M' is a number. Here, DAC refers to an apparatus that converts digital data (e.g., binary or thermometer coded) into an analog signal (current, voltage, or electric charge).

The impedance looking from the source of transistors MN1a and MN1b increases at high frequency to increase the voltage swing. The size ratio of transistor MN1a to transistor MN2a (or transistors MN3a, MN4a, MN5a) determines a common-mode level of the voltage swing at the input of the final driver switch (MN5a), which is around 0.6 V in nominal condition in one example. By controlling Vbias1, the common-mode is further adjusted. The resistance at the gate of transistor MN1a provides impedance peaking and be controlled by separate gate bias voltage (Rpeak_ctrl). Looking from node n1 towards transistors MP1a and MN1a, boost in high frequency is observed because transistor MN1a behaves like an inductor on node n1 because of the resistance from transistor MP1a at the gate of transistor MN1a, in accordance with various embodiments.

Figure 3:
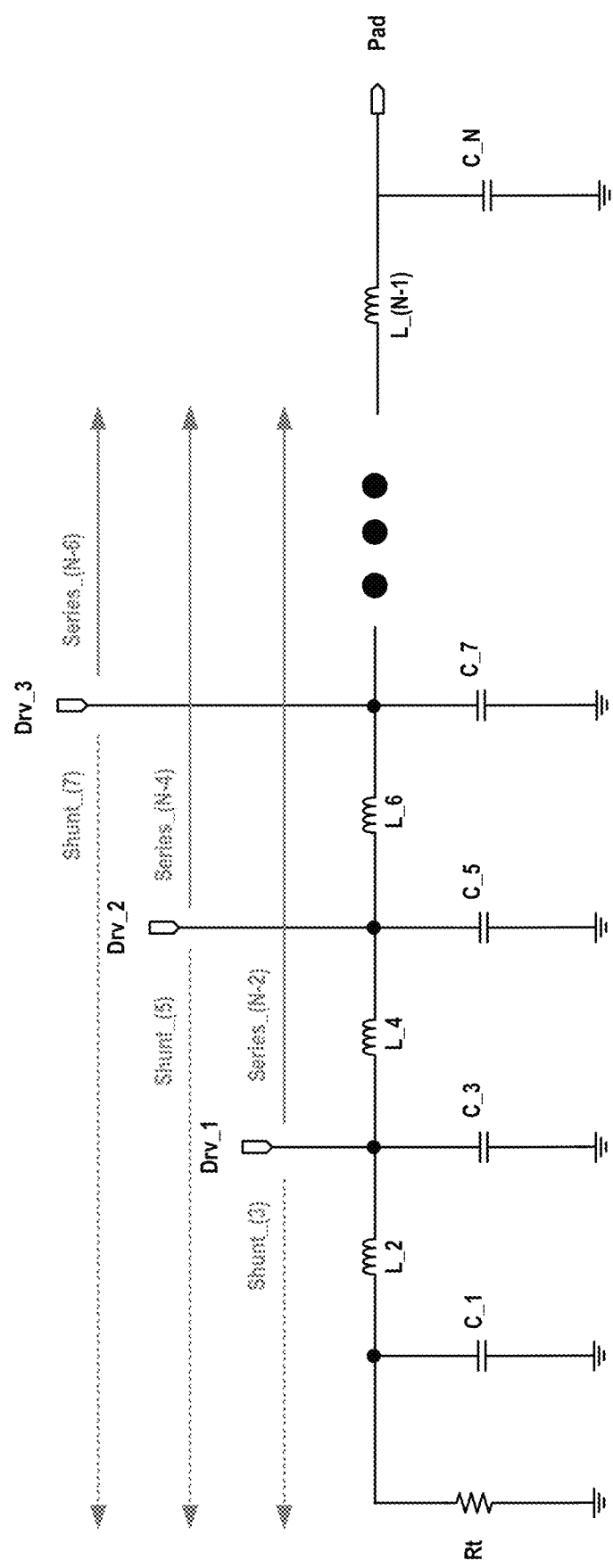
FIG. 3 illustrates a $N^{th}$ order LC filter with shunt peaking, in accordance with some embodiments.

In some embodiments, resistive device implemented by transistor MP1a can also be implemented with an n-type device or a combination of an n-type and p-type device. In some embodiments, the outputs from transistors MN5a and MN5b (e.g., the drain terminal of transistors MN5a and MN5b) are coupled to filter 105 (e.g., Bessel-like filter) with four inductors and distributed electrostatic discharge (ESD) circuits. One such example of the Bessel-like filter is illustrated by FIG. 3.

Referring back to FIG. 1, the final driver (comprising transistors MN5a and MN6a of one branch and transistors MN5b and MN6b of another branch) is operating differentially with current source (MN6a and MN6b) to generate controlled current to the output. Because the two-stage design enables small sizing of the final driver, thus small overall capacitance at the output of driver, the output pad network can effectively compensate parasitic capacitance from all circuits and interconnects up to the Nyquist frequency of 56 GHz providing wide gain bandwidth and minimal phase distortion (group delay). Therefore, the TX can meet stringent bandwidth requirement while achieving very good jitter and linearity performance. The power consumption is also optimized by properly sizing 4:1 serializer and preceding pulse generators.

While apparatus 100 illustrates a differential time-interleaved 4-way data serializing transmitter front-end, the embodiments are applicable to a single-ended time-interleaved 4-way data serializing transmitter front-end.

Figure 1B:
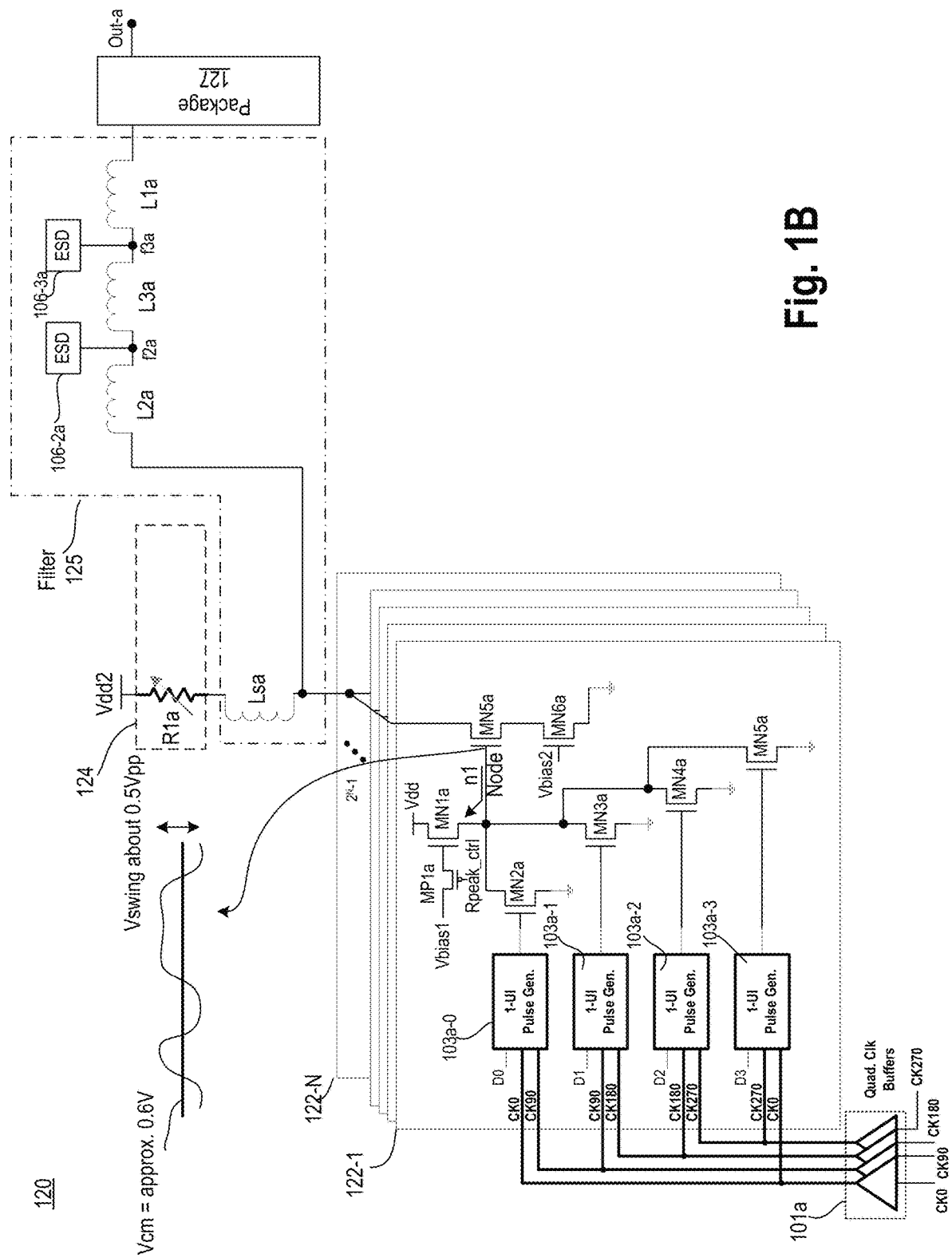
FIG. 1B illustrates an apparatus comprising single-ended time-interleaved 4-way data serializing transmitter front-end using active inductor with gate-resistor peaked n-type load in a serializer, in accordance with some embodiments.

FIG. 1B illustrates apparatus 120 comprising single-ended time-interleaved 4-way data serializing transmitter front-end using active inductor with gate-resistor peaked n-type load in a serializer, in accordance with some embodiments. Apparatus 120 is similar to apparatus 100 bit for replacing N single-ended time-interleaved 4-way data serializing transmitter front-end circuits 122-1 through 122-N, and filter 125 with single-ended shunt inductor Lsa, and inductors coupled to distributed ESD devices. Single-ended filter 125 is coupled to package 127, which provides the single-ended output Out-a. In various embodiments, transistors MN1a, MP1a, MN2a, MN3a, MN4a, MN5a, and MN6a form a single-ended 4:1 driver that drives the shunt inductor set 124 and filter 125.

Figure 2A:
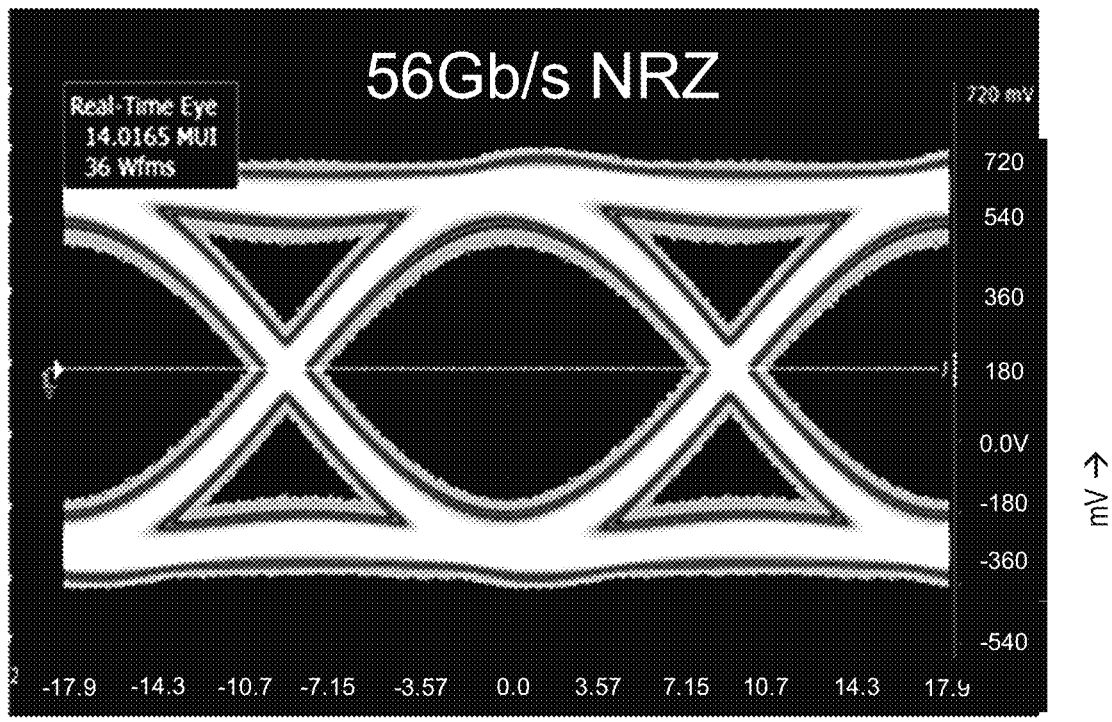
FIGS. 2A-D illustrate a set of plots showing measured eye-diagrams for the apparatus of FIG. 1, in accordance with some embodiments.
Figure 2B:
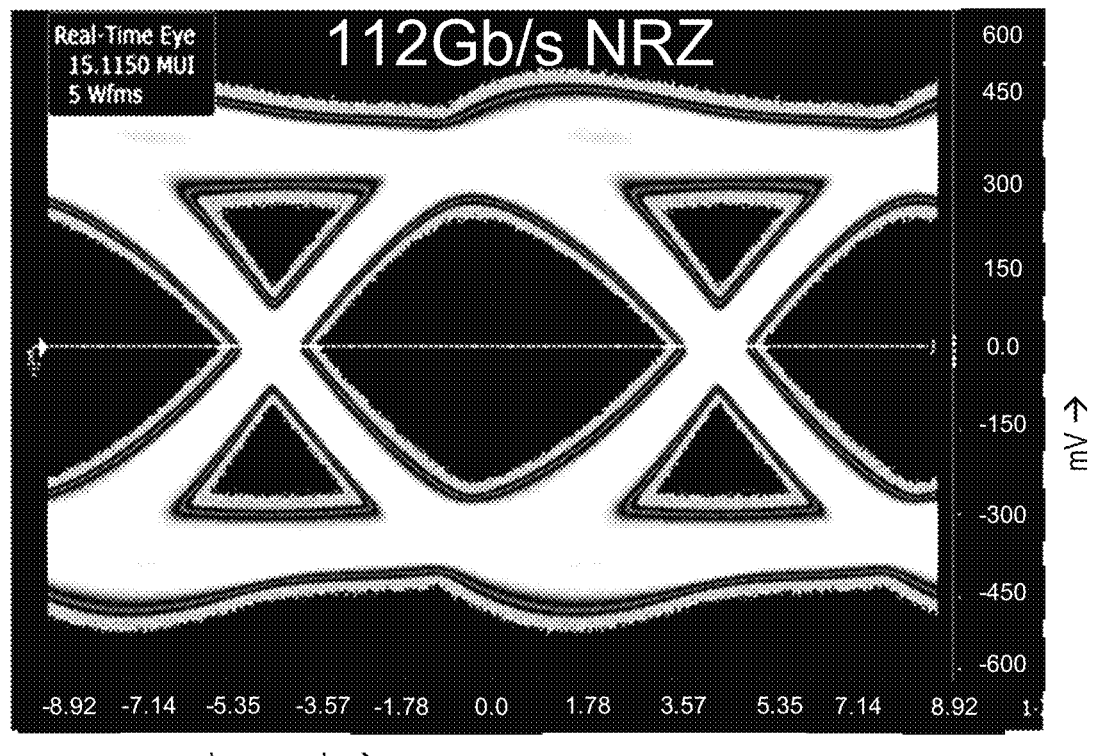
Figure 2C:
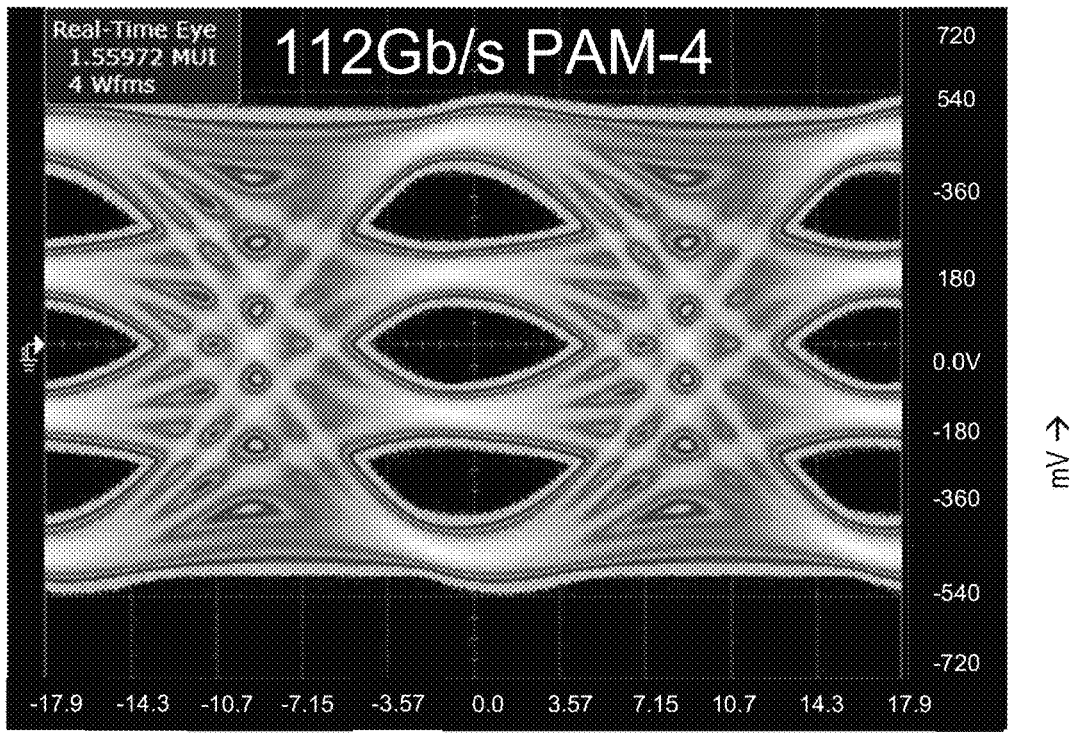
Figure 2D:
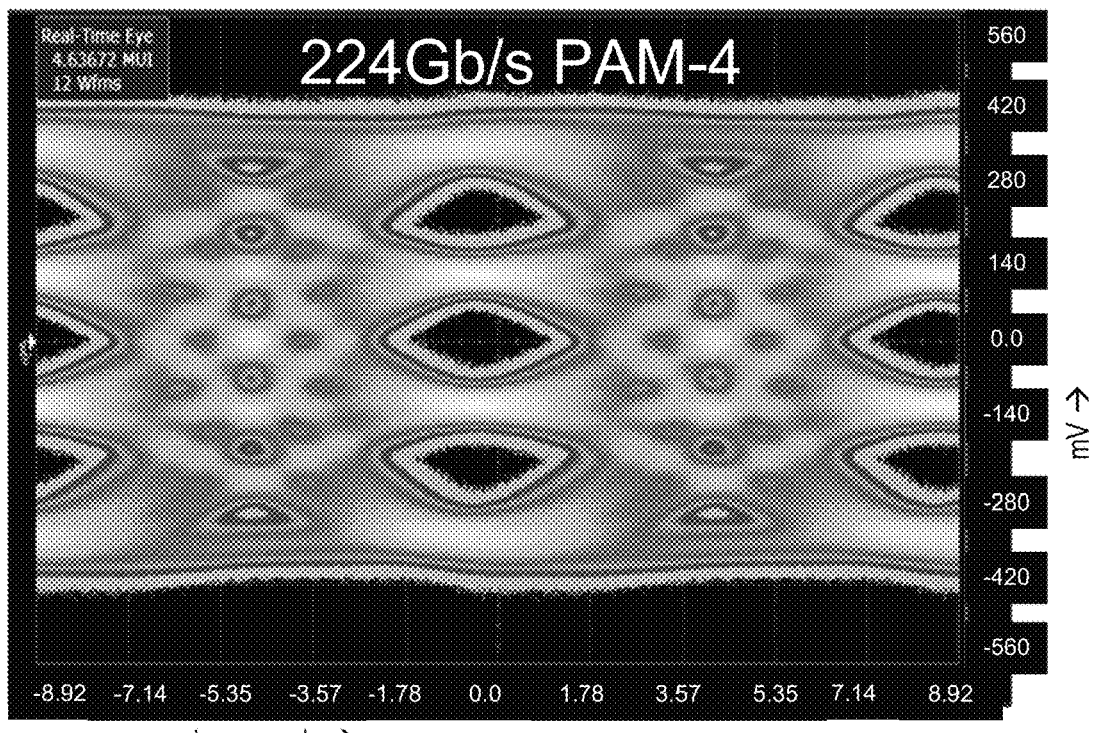

FIGS. 2A-D illustrate a set of plots 200, 220, 230, and 240 showing eye-diagrams, respectively, for the apparatus of FIG. 1, in accordance with some embodiments. FIG. 2A illustrates pseudorandom binary sequence (PRBS-13) non-return-to-zero (NRZ) of the DAC TX at 56 Gb/s. FIG. 2B illustrates plot 220 showing a NRZ eye diagram of the DAC TX of FIG. 1 at 112 Gb/s. FIG. 2C illustrates plot 230 showing quaternary pseudo random binary sequence (QPRBS-13) PAM-4 of the DAC TX of FIG. 1 at 112 Gb/s. FIG. 21) illustrates plot 240 showing QPRBS-13 PAM-4 eye diagram of DAC TX of FIG. 1 at 224 Gb/s.

Parasitic capacitance at an output (e.g., Out-a and Out-b) of high-speed transmitter can be compensated by inductors to maintain good signal integrity. While the device parasitic capacitance from the transmitter could benefit from CMOS scaling and transmitter architecture innovations, the parasitic capacitance from ESD diodes do not scale. In some examples, T-coil based matching network is used for source-series-terminated (SST) driver-based transmitters operating up to 64 Gb/s baud-rate to compensate ESD diode capacitance. However, baud-rate above 64 Gb/s are a challenge for T-coil based matching network. In some examples, Pi-coil based matching network (which adds another shunt peaking inductor to boost bandwidth) is used for current-mode-logic (CML) driver-based transmitters operating at 56 Gb/s baud-rate. To double the 3-dB bandwidth of the output matching network, one challenge is to preserve constant amplitude gain and linear phase variation (or constant group delay). At the same time, it is preferred that physical area of the matching network should be reasonably small to be integrated within a silicon die.

In some embodiments, an inductor based matching network is used at the output of the transmitter (e.g., DAC TX of FIG. 1). Some embodiments use a distributed Bessel-like filter that combines shunt L-C path along with series L-C path to implement output matching network suitable for distributing pad driver elements along the filter. The filter of some embodiments resembles a Bessel filter to maintain flat group delay response even above 56 GHz Nyquist frequency. In one example, on the shunt path, large enough capacitance is allocated to accommodate any of modern high-speed transmitter architecture. In addition, the series path can accommodate higher filter order providing flexibility on distributing ESD diodes. In one instance, the inductor based matching network achieves 3-dB bandwidth of greater than 56 GHz (e.g., suitable for 112 Gb/s Baud-rate TX) with realized constant gain and group delay response within area of 2200 um$^2$.

FIG. 3 illustrates N-th order LC filter 300 with shunt peaking, in accordance with some embodiments. In the N-th order LC filter of some embodiments, the driver block can be distributed along the shunt peaking tap points. Ideal Bessel filters use unpractically small values for the required capacitance, limiting physical implementation. In the filter of some embodiments, the shunt peaking paths provide zeros, which natively cancel the large parasitic capacitance at the shunt peaking node. Therefore, active and passive devices including driver circuitry, ESD diodes, and any other sensing circuitry could be flexibly added on any L-C filter nodes. Note, in the implementation of FIG. 1, ESD diodes are distributed between the LC-filter nodes f2a, f2b, f3a, and f3b. In some embodiments, Drv_1 node couples to ESD diode(s), Drv_2 node couples to ESD diode(s), Drv_3 node couples to ESD diode(s), and so on. Here, inductor L_2 is same as L2a, and is coupled to shunt inductor Lsa and resistor R1a. Bessel-like LC filter 300 is a single-ended filter. In some embodiments, a differential 9$^{th}$ order LC filter is organized as shown in FIG. 1.

In one example, an ideal 9th order Bessel filter with 56 GHz cutoff frequency requires the first capacitance (C1) and the second capacitance (C3) to be 3.5 fF and 17.1 fF, which are too small to accommodate driver circuits, parasitic capacitance from on-chip inductors, or ESD diode capacitance. If parasitic capacitance becomes larger than the Bessel filter requirement, the filter response trends toward Chebyshev or Butterworth filters, where group delay response is not as flat. On the other hand, with the filter of various embodiments, the driver could be added on "Drv_1" or "Drv_2" depending on the driver circuit parasitic capacitance and the parasitic from the termination resistor (Rt). If preferred, the drivers could be distributed along with the multiple feeding points.

Figure 4A:
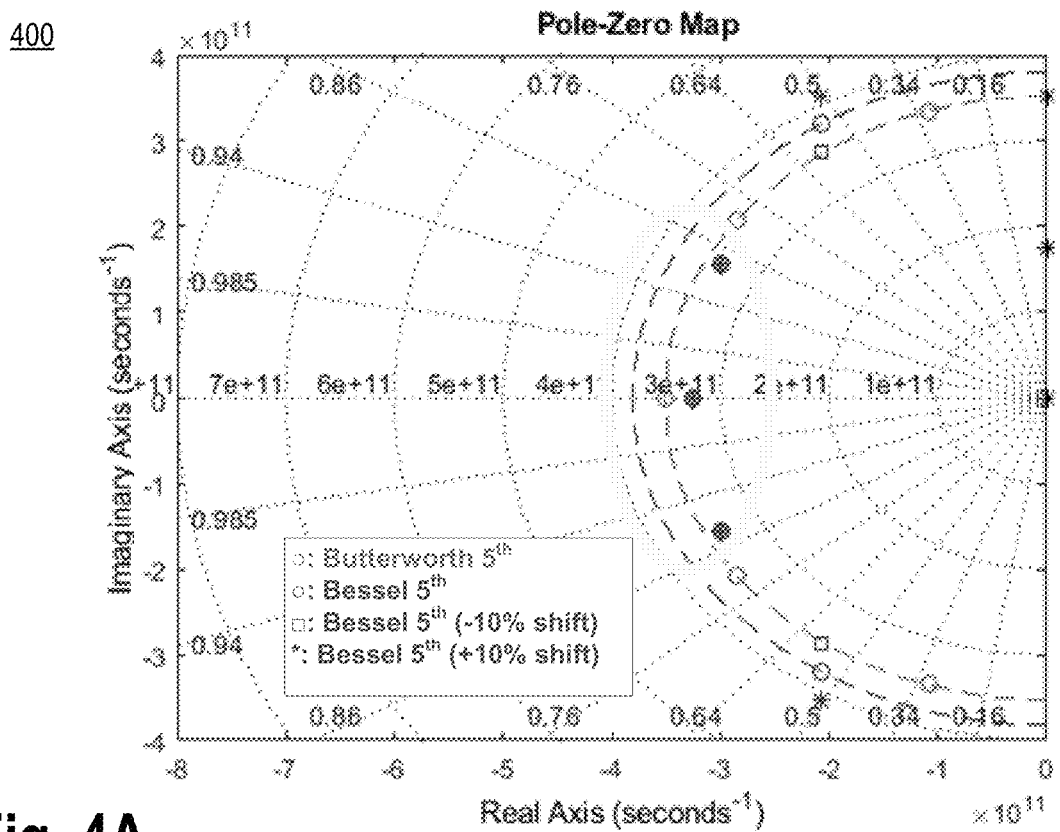
FIGS. 4A-B illustrate plots pole-zero map and group delay response for $5^{th}$ Butterworth (56 GHz), $5^{th}$ Bessel filter (56 GHz), and $5^{th}$ Bessel filter with highest frequency complex pole pair shifted by +/−10%, respectively.
Figure 4B:
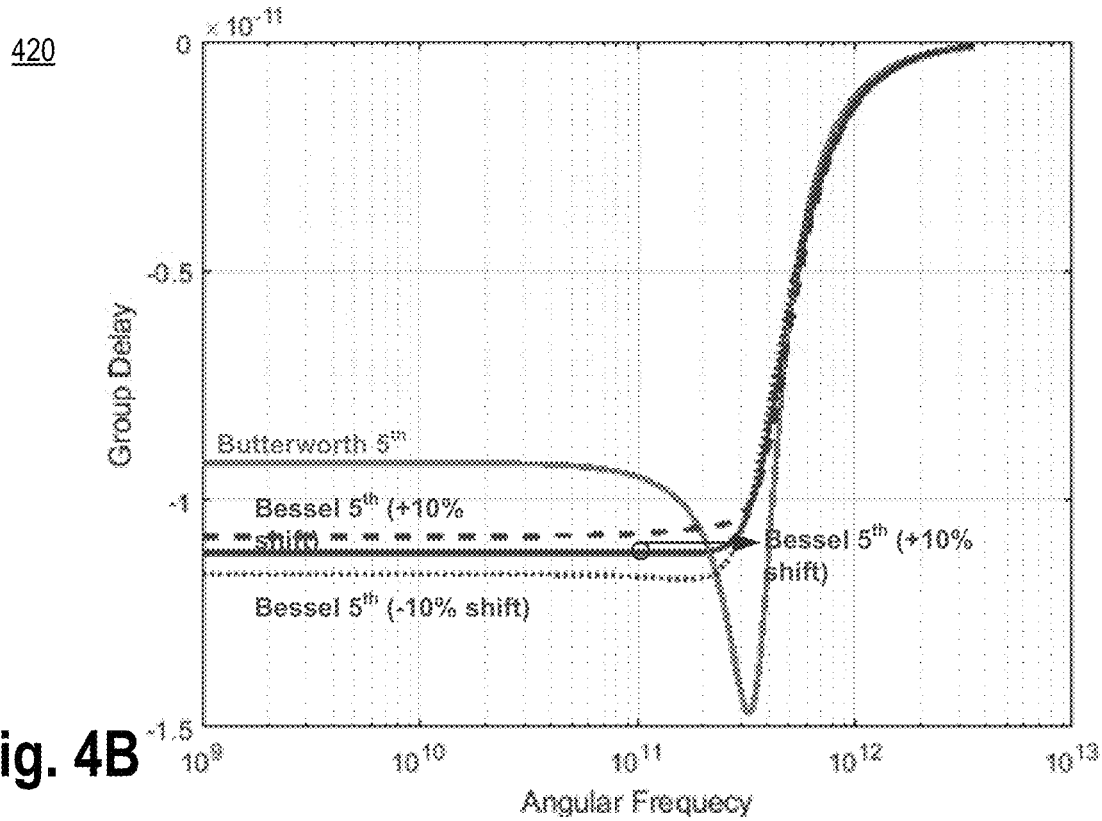

FIGS. 4A-B illustrate plots 400 and 420, respectively, showing pole-zero map and group delay response for 5$^{th}$ Butterworth (56 GHz), 5$^{th}$ Bessel filter (56 GHz), and 5$^{th}$ Bessel filter with highest frequency complex pole pair shifted by +/−10%, respectively. Plots of FIGS. 4A-B show the complex pole-zero map for 5th order Bessel (blue) and Butterworth (red) filter. To demonstrate how the pole location can impact on the group delay response, the highest frequency complex pole pair of the 5th Bessel filter are shifted by +/−shifted. According to FIGS. 4A-B, group delay is more sensitive to the poles located on high damping factor region (yellow region).

Figure 5A:
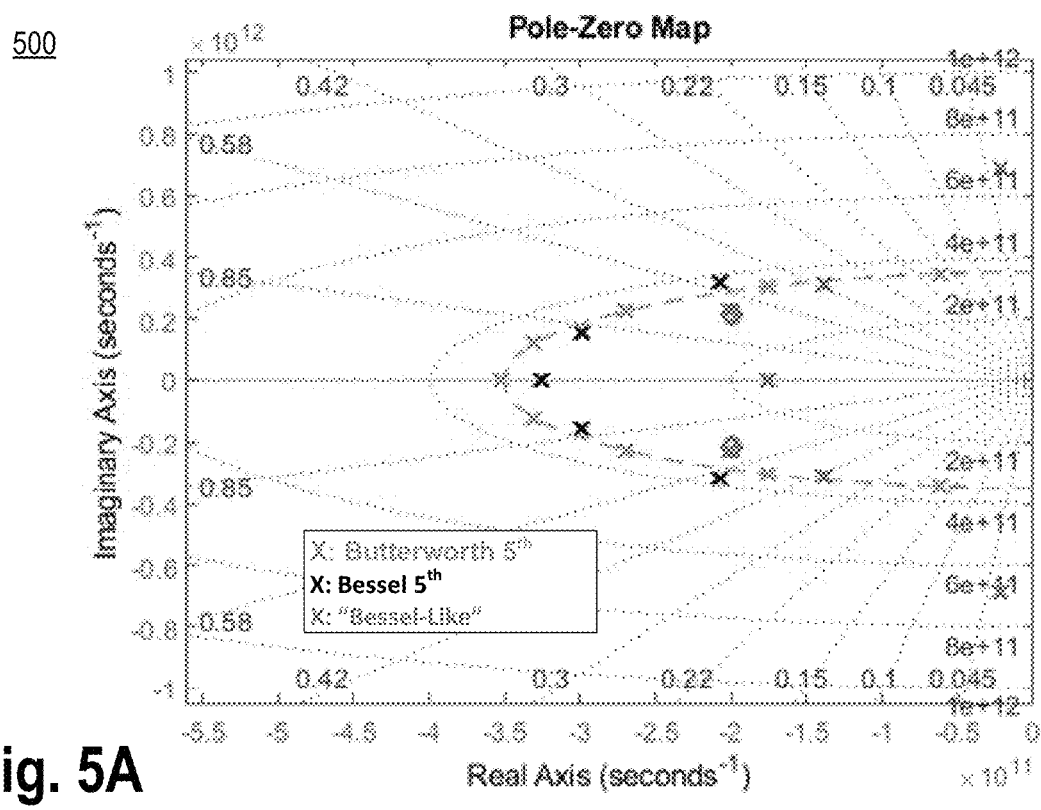
FIGS. 5A-B illustrate pole-zero map and group delay response for $5^{th}$ Butterworth (56 GHz), $5^{th}$ Bessel (56 GHz), and $5^{th}$ order Bessel-like filter, respectively, in accordance with some embodiments.
Figure 5B:
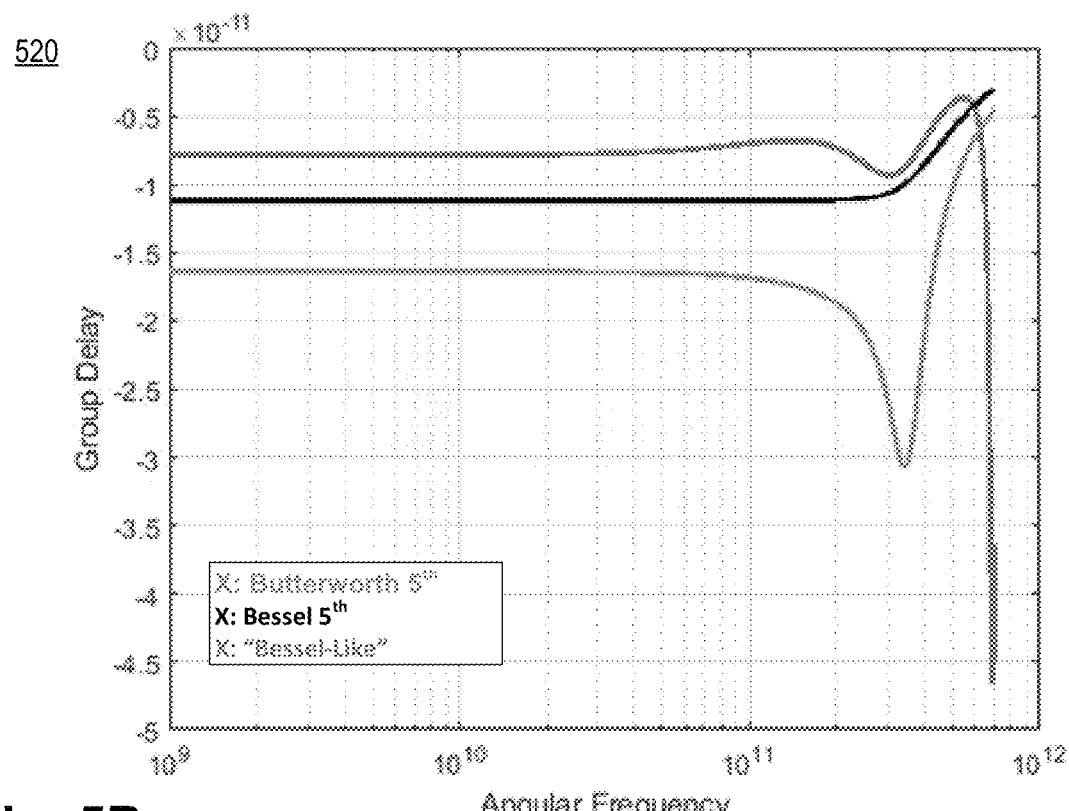
Figure 5C:
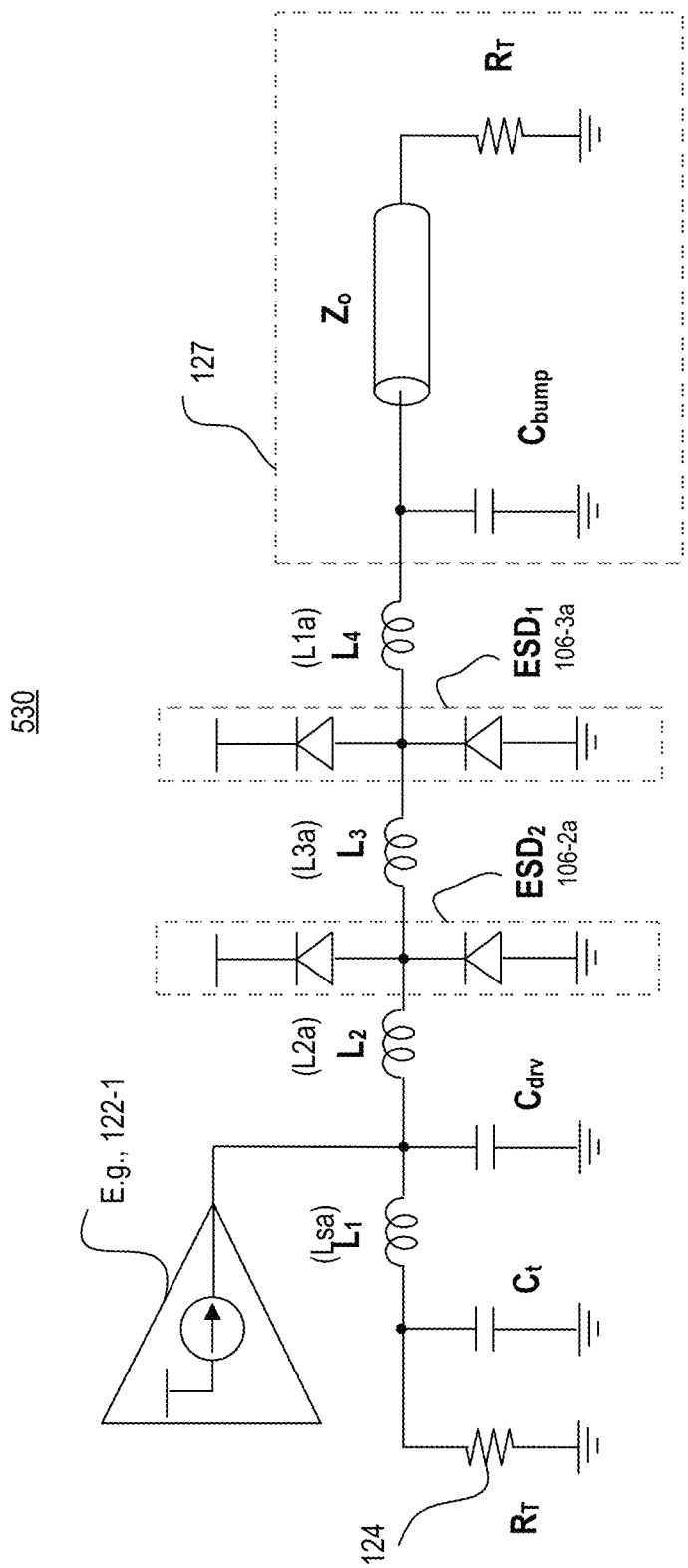
FIGS. 5C-5D illustrate $9^{th}$ Bessel-like filter (56 GHz) employing parasitic capacitance from all circuit components and a layout floor plan of physically implemented the 9th Bessel-like filter, respectively, in accordance with some embodiments.
Figure 5D:
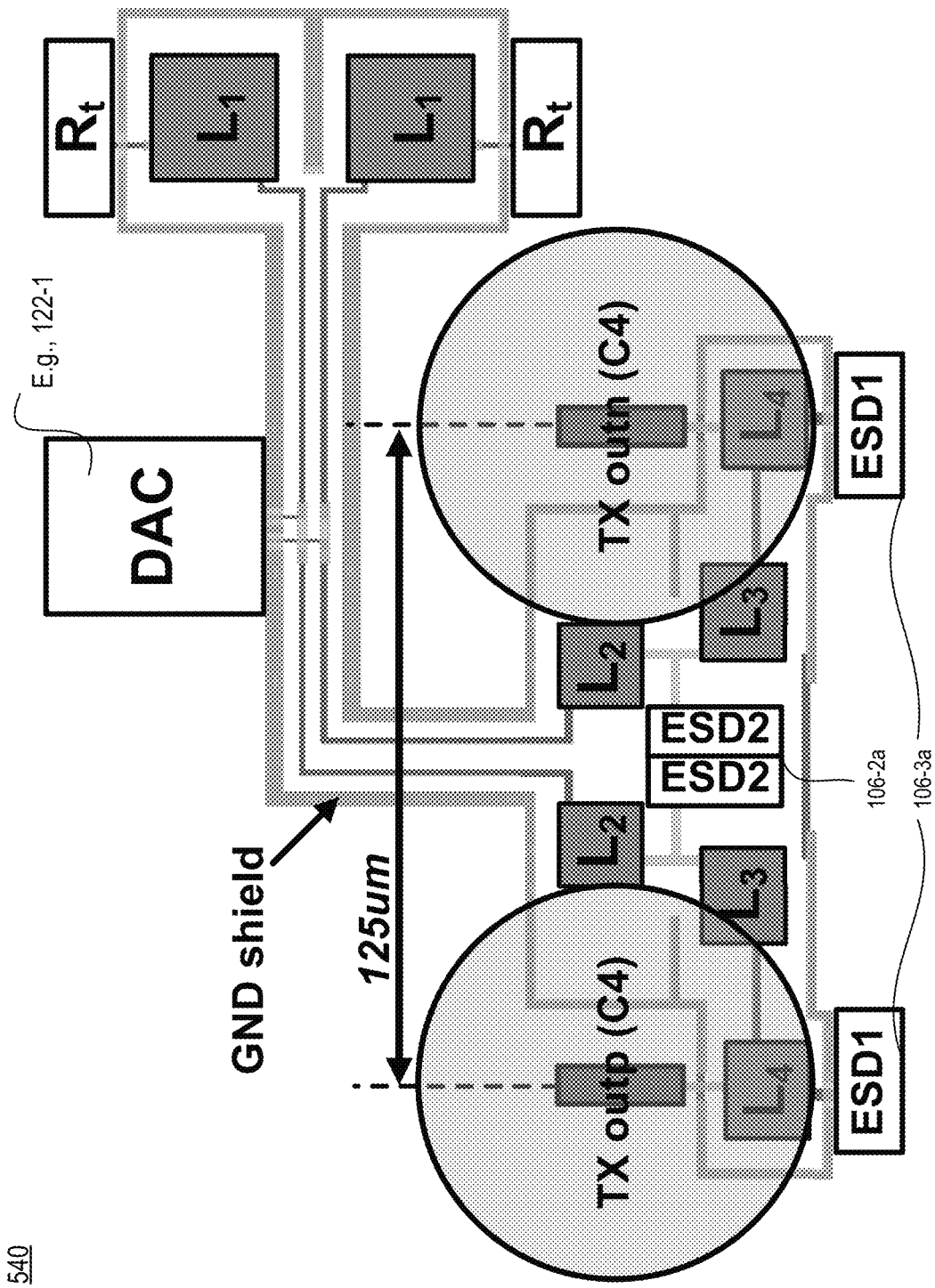
Figure 5E:
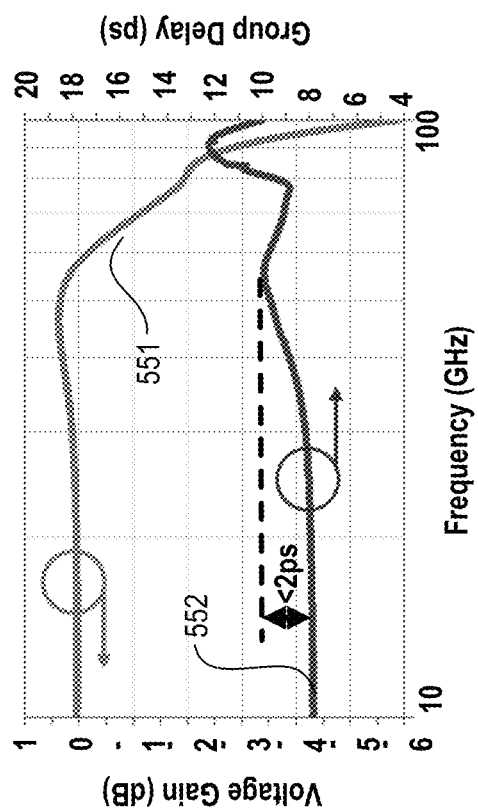
FIG. 5E illustrates simulation results of gain-bandwidth and group delay for the $9^{th}$ Bessel-like filter of FIG. 5C, in accordance with some embodiments.
Figure 5F:
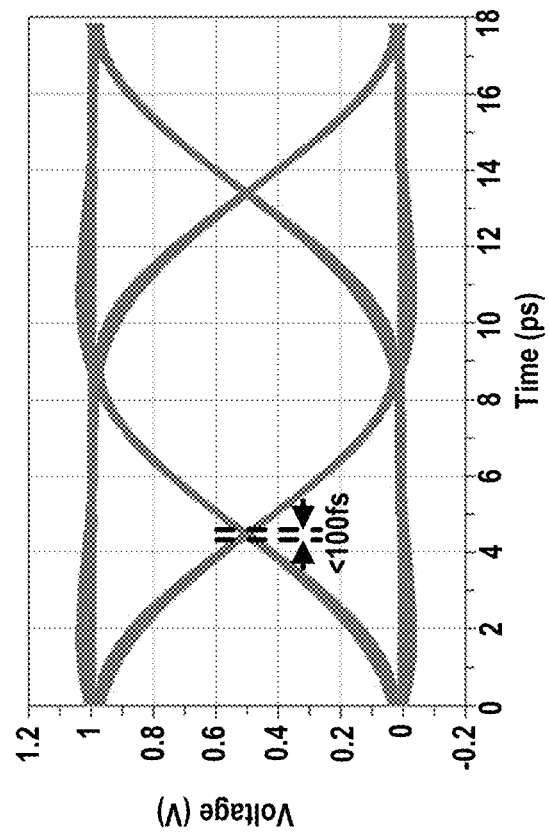
FIG. 5F illustrates a PRBS NRZ eye diagram (112 Gb/s) for the $9^{th}$ Bessel-like filter of FIG. 5C, in accordance with some embodiments.

FIGS. 5A-B illustrate a set of plots 500 and 520, respectively, pole-zero map and group delay response for 5$^{th}$ Butterworth (56 GHz), 5$^{th}$ Bessel (56 GHz), and 9$^{th}$ order Bessel-like filter, respectively, in accordance with some embodiments. In the filter of some embodiments, larger and practical capacitance values are added on the shunt path providing flexible parasitic budgets for the transmitter design. Plots 500 and 520 show the complex pole-zero map and the group delay response for 5th order Bessel (black) and Butterworth (green) filter along with a 9th order Bessel-like filter example (red). Due to the pole-zero cancellation, the 9th order filter of some embodiments shows similar pole-zero/group delay response as the 5th order Bessel filter up to 56 GHz frequency.

Table 1 shows the ideal L-C components used for the Bessel-like filter example used in FIGS. 5A-B, showing higher capacitance values could be used on C1 and C3 components.

TABLE 1

|  | Fcut (GHz) | Rs (Ohms) | C1 (fF) | L2 (pH) | C3 (fF) | L4 (pH) | C5 (fF) | L6 (pH) | C7 (fF) | L8 (pH) | C9 (fF) |
|---|---|---|---|---|---|---|---|---|---|---|---|
| Bessel | 56 | 50 | 4.4 | 32.9 | 21.4 | 72.6 | 35.8 | 105.3 | 49.1 | 154.4 | 128.7 |
| Bessel-like | 56 | 50 | 50 | 230 | 150 | 45.0 | 40 | 35 | 40 | 136 | 40.3 |

FIGS. 5C-5F illustrate $9^{th}$ Bessel-like filter 530 (56 GHz) employing parasitic capacitance from all circuit components, layout floor plan 540 of physically implemented the 9th Bessel-like filter, and its simulation plots 550 of gain-bandwidth 551, group-delay 552, and PRBS NRZ eye diagram 560 (112 Gb/s), respectively, in accordance with some embodiments. Here, the $9^{th}$ Bessel-like filter 530 is a single-ended version of example of filter 125. Layout floor plan 540 shows the ground shield applies to signals from DAC 122-1 all the way to the package bumps of package 127.

Figure 6:
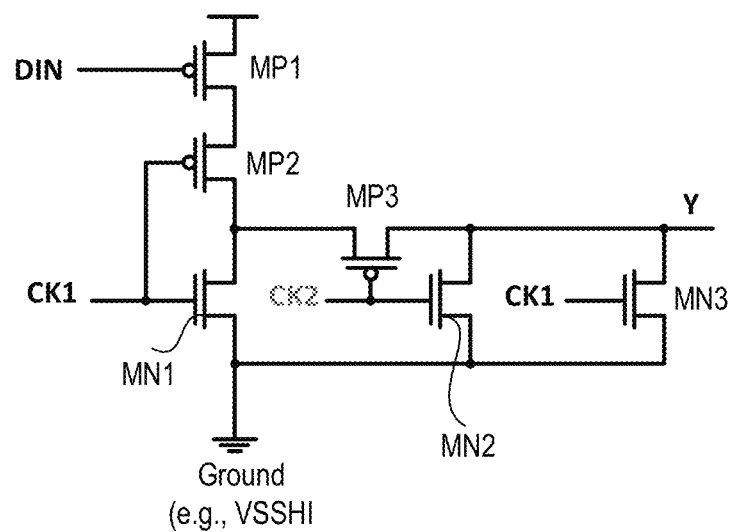
FIG. 6 illustrates a 1-UI (unit interval) pulse generator.

FIG. 6 illustrates a 1-UI (unit interval) pulse generator 600 (e.g., 103-a2). Pulse generator 600 comprises of p-type transistor MP1, MP2, and MP3, and n-type transistors MN1, MN2, and MN3 coupled as shown. The output node is 'Y'. MP1 is driven by DIN (data such as D0, D1, D2, etc.). Transistors MN1 and MN3 are driven by clock CK1 and transistors MN2 and MP3 are driven by CK2. In some embodiments, the 1-UI pulse generators of FIG. 1 include the implementation of FIG. 6. For, DAC-based architecture for transmitters, the quality of the quadrature clock distribution is linked to the output signal integrity and takes up a majority portion of the overall driver power consumption. For a given clock frequency, the quadrature clock distribution is determined the input fan-in of the overall pulse generator block. Therefore, implementing pulse generator with minimal loading is highly looked-for for reducing energy consumption.

Figure 7A:
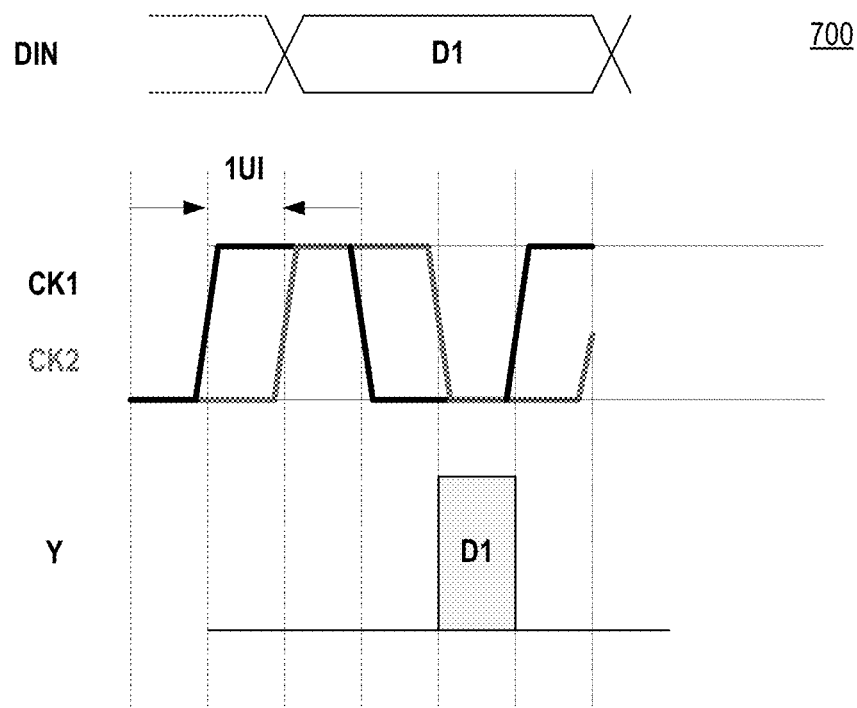
FIGS. 7A-B illustrate pulse generated using clocks having square-like waveform and sinusoidal waveforms, respectively.
Figure 7B:
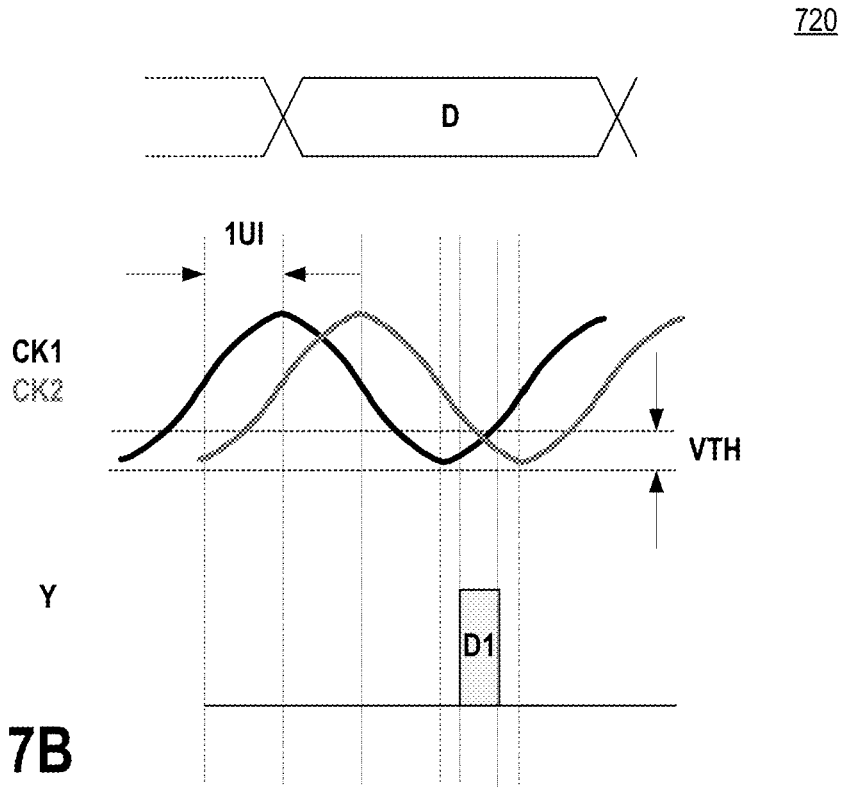

FIGS. 7A-B illustrate set of plots 700 and 720, respectively showing pulse generated using clocks having square-like waveform and sinusoidal waveforms. When pulse generator 600 is used in a 4-way interleaved transmitter, the pulse generator takes two 4-UI clocks, CK1 and CK2, separated by 1-UI. An example of pulse generator operating waveforms is shown in plot 700, where typical CMOS based quadrature clock distributions result in finite rise and fall time clock transitions. For clock distributions above 28 GHz, it is found that a jitter reduction technique such as shunt-series clock distribution, which shapes the clock waveform to sinusoidal, is used to meet the aggressive jitter target. As a result, for high data rate above 112 Gb/s, sinusoidal-shaped clock waveforms are expected due to tighter jitter budget as shown in plot 720 and as the quadrature 28 GHz clock distribution becomes too tight to support conventional CMOS based buffers.

With the sinusoidal-shaped clock waveforms as shown in plot 720, pulse generator 600 encounters reduction in the output pulse height as well as the pulse width variations susceptible to any process and temperature variations. Note, the amplitude of D1 is smaller in plot 720 than in plot 700.

In some embodiments, a pulse width tuning technique is used with tunable VSSHI voltage on the ground terminal of pulse generator 600 to tune the effective threshold voltage of pulse generator 600. With this tuning capability, the 1-UI pulse width can be tuned without changing the clock distribution or the pulse generator circuit. Therefore, the clock distribution and the pulse generator block can have more optimally sized for high energy efficiency, in accordance with some embodiments. One such tunable VSSHI voltage generator is illustrated in FIG. 8.

Figure 8:
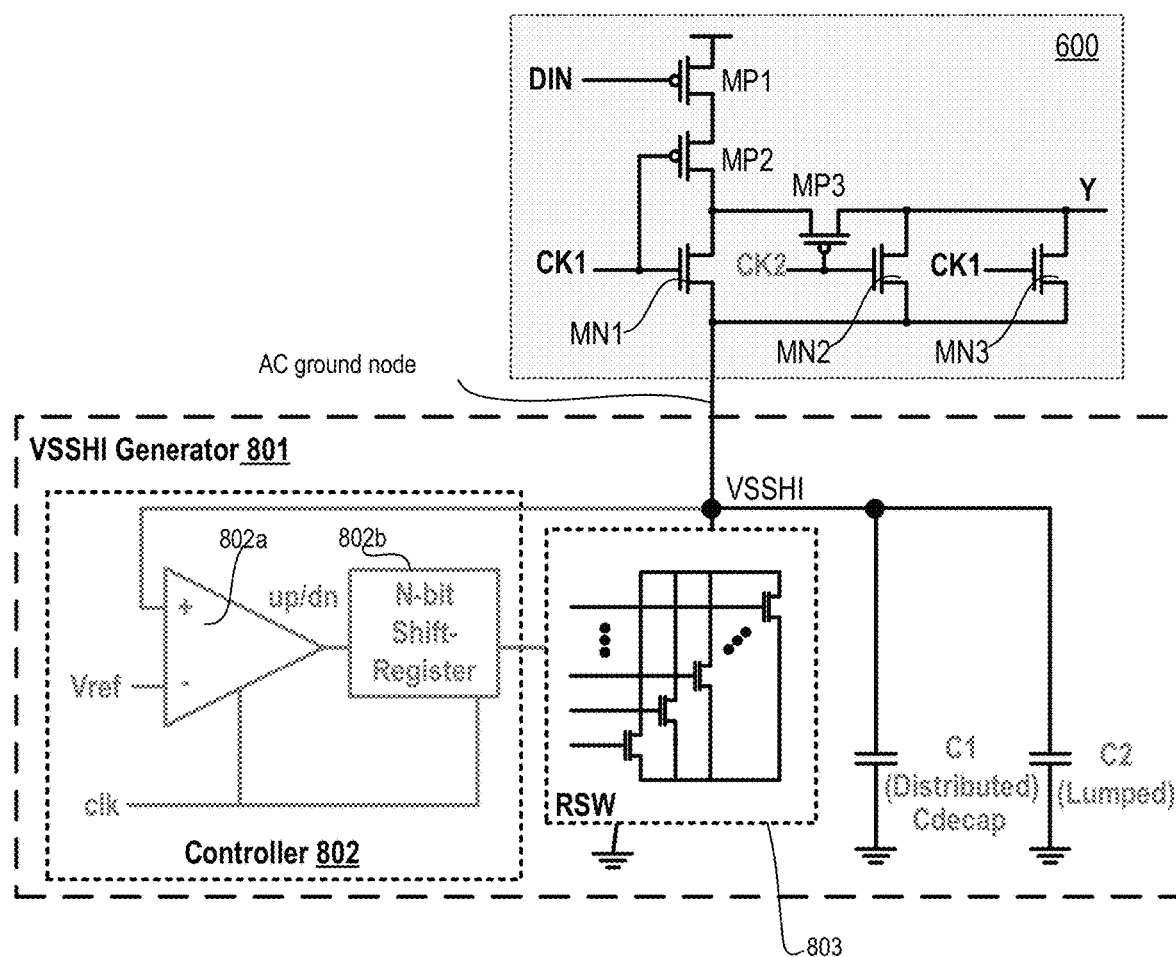
FIG. 8 illustrates an apparatus with pulse width tuning, in accordance with some embodiments.

FIG. 8 illustrates apparatus 800 with pulse width tuning, in accordance with some embodiments. In some embodiments, VSSHI generator 801 comprises controller 802, a resistor switch (RSW) 803, distributed decoupling capacitors C1 and lumped capacitor C2. In some embodiments, controller 802 comprises comparator 802a or amplifier 802a, and an N-bit shift-register 802b. In some embodiments, comparator 802a compares the ground of pulse generator 600 with a reference, and changes the resistance of the virtual or AC ground node (VSSHI) of pulse generator 600. The output up/dn of comparator 802a indicates whether to cause n-bit shift-register 802b to shift a code value up or down. For example, if VSSHI voltage is below Vref, then the output of comparator causes N-bit shift-register 802b to count up. The output of N-bit shift-register is a code which is a number of bits. The bits are used to turn on/off the transistors that are coupled between nodes VSSHI and ground. These transistors coupled in parallel form resistor switch. By changing the number of transistors that are on or off, the resistance of RSW 803 changes, which changes the voltage on node VSSHI. A feedback loop is established between VSSHI, controller 802 and RSW 803. The resistance between ground and the virtual or AC ground node is changed using this feedback loop by adjusting the resistance of RSW 803 till the voltage on VSSHI is substantially equal to the reference Vref.

Figure 9:
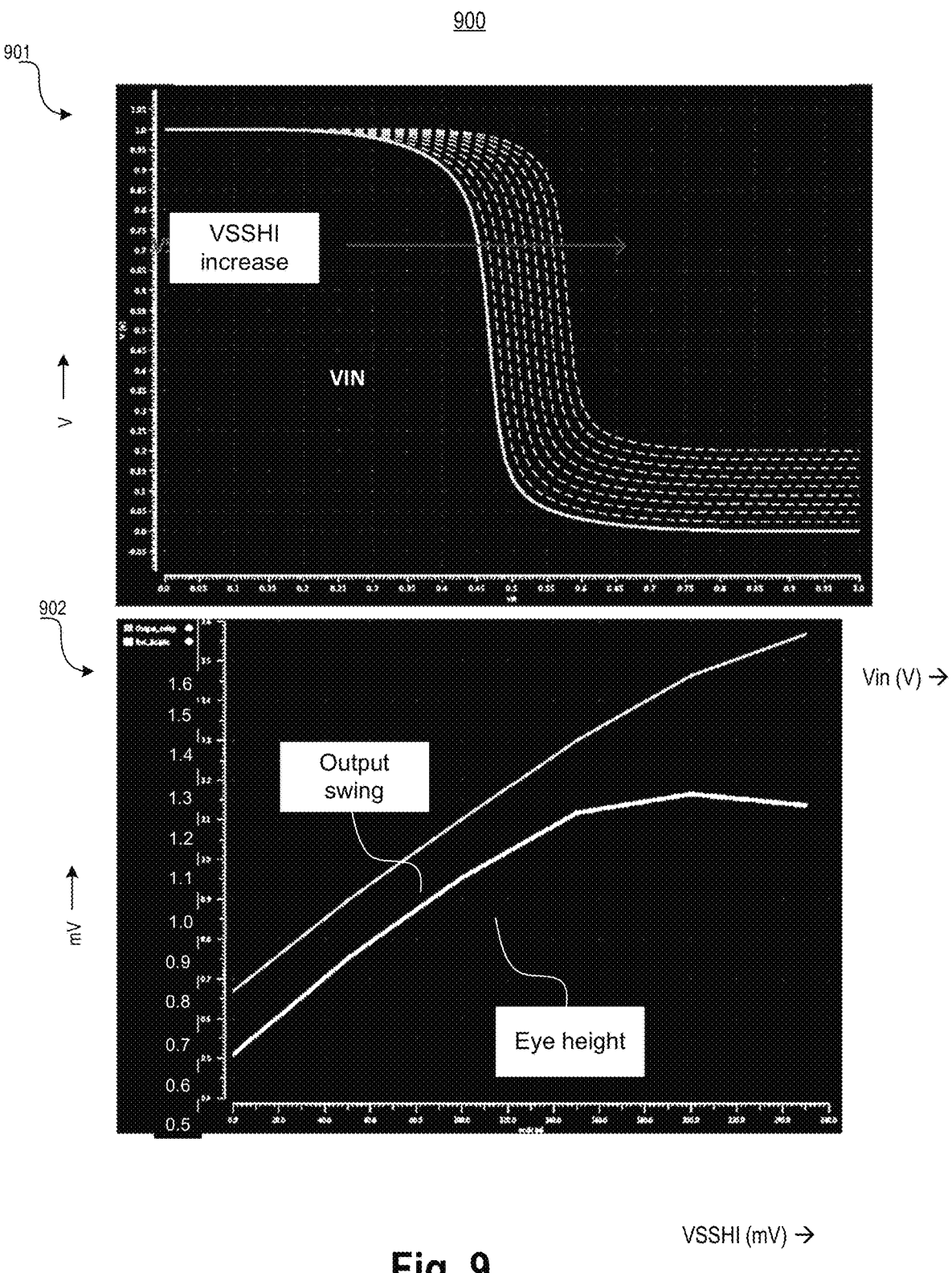
FIG. 9 illustrates a plot showing effect of change in VssHi using apparatus of FIG. 6, in accordance with some embodiments.

FIG. 9 illustrates a set of plots 900 showing effect of change in VSSHi using apparatus of FIG. 6 (see plot 901) in accordance with some embodiments. Plot 902 shows TX output swing and 112 Gb/s NRZ (non-return to zero) eye height with VSSHI tuning.

Figure 10A:
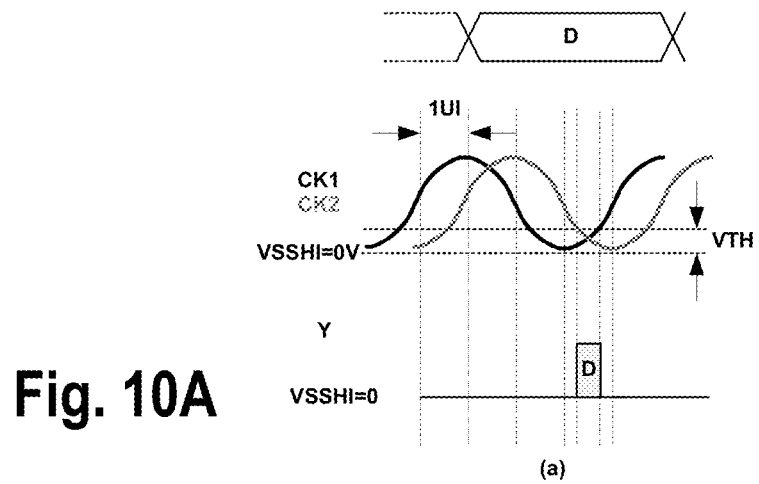
FIGS. 10A-C illustrate a set of plots showing operation of the apparatus of FIG. 6, in accordance with some embodiments.
Figure 10B:
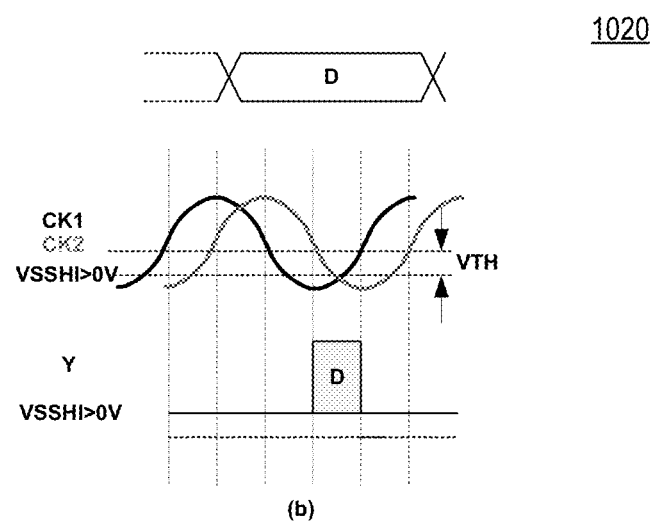
Figure 10C:
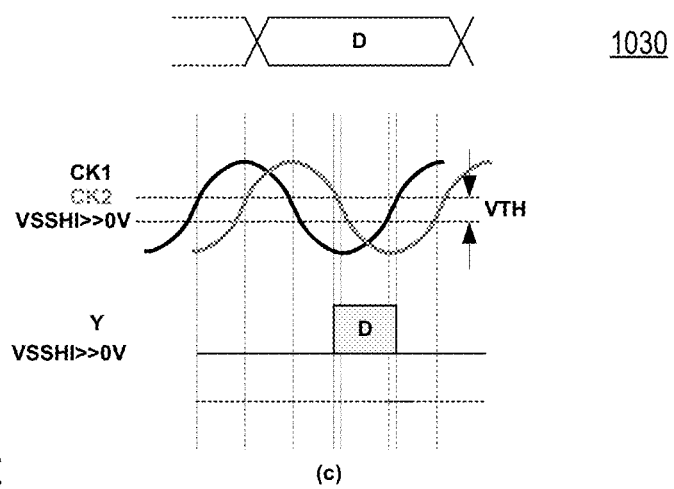

FIGS. 10A-C illustrate a set of plots 1000, 1020, and 1030, respectively, showing operation of the apparatus of FIG. 6, in accordance with some embodiments. When pulse generator 600 makes active transitions, the effective threshold voltage can be raised by increasing the VSSHI level on node VSSHI. For realistic quadrature clock signals with limited rise and fall times, the pre-charging NMOS devices has a discharging period longer than 3-UI resulting in an output pulse smaller than 1-UI as shown by plot 1000 in FIG. 10A. The narrower than 1-UI pulse width deteriorates the height of the pulse at the input of the final driving stage due to parasitic R-C interconnect, thus degrading the overall output eye metrics. When VSSHI level is raised by the VSSHI generator 801, the pulse generator trip point can be shifted up to compensate the limited clock rise and fall times as shown by plot 1020 of FIG. 10B. Excessively high VSSHI levels can be avoided (as shown by plot 1030 in FIG. 10C) as they can result in contention at the differential TX outputs.

In some embodiments, the bandwidth of VSSHI generator 801 is low compared to the frequency of clock signals CK1, CK2. Because of the low bandwidth of VSSHI generator 801, the VSSHI generator control signals and the compensation scheme may not need huge routing or silicon resources. In addition, the overall currents drawn out of the overall 4-UI pulse generators are clock-frequency dependent rather than data-dependent. Therefore, the VSSHI level can be regulated with low-bandwidth control loop with simple tunable resistance with minimal amount of distributed local decoupling capacitance (C2). In some embodiments, pulse generator 600 is located physically close to the final driver stage (comprising MN6a, MN5a of FIG. 1) to minimize parasitic loading. The close proximity of the pulse generator allows for low physical implementation cost of the VSSHI generator, which is another potential benefit in pushing for higher data rates.

Figure 11:
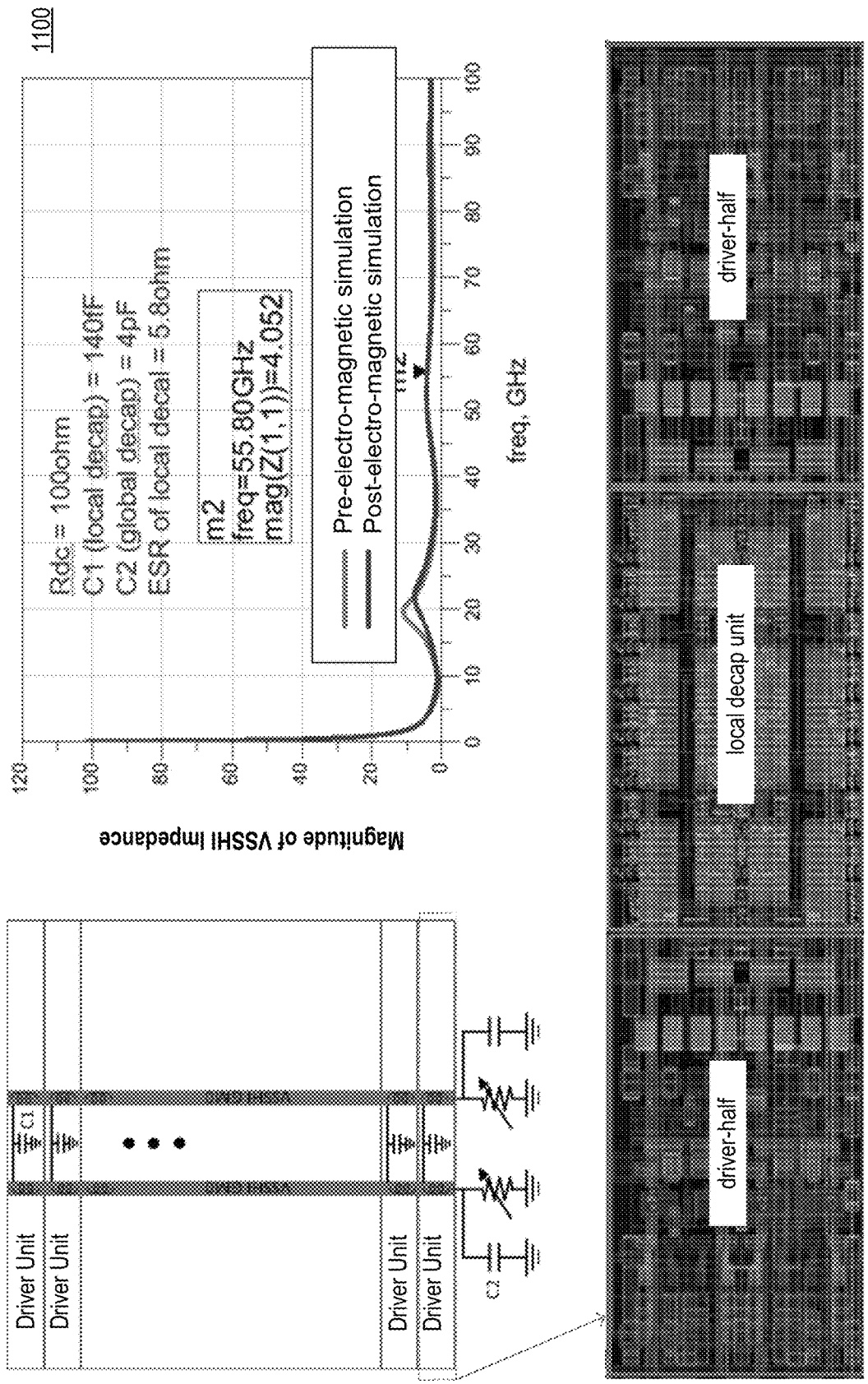
FIG. 11 illustrates a layout floorplan of a driver with apparatus of FIG. 6, in accordance with some embodiments.

FIG. 11 illustrates layout floorplan 1100 of a driver with apparatus of FIG. 6, in accordance with some embodiments. In this example, floorplan 1100 is of 10 nm 224 Gb/s PAM-4 driver where the VSSHI generator blocks could be located away from the driver block in a non-intrusive manner. The empty space in the driver unit layout is enough to utilize local decoupling capacitors to suppress the high frequency impedance ripples to lower than 5 Ohm on the VSSHI trace. In this example, 140 fF capacitance is allocated on the local capacitor (C1) while 4 pF of lumped capacitor is allocated along with the VSSHI block away from the driver layout.

Figure 12:
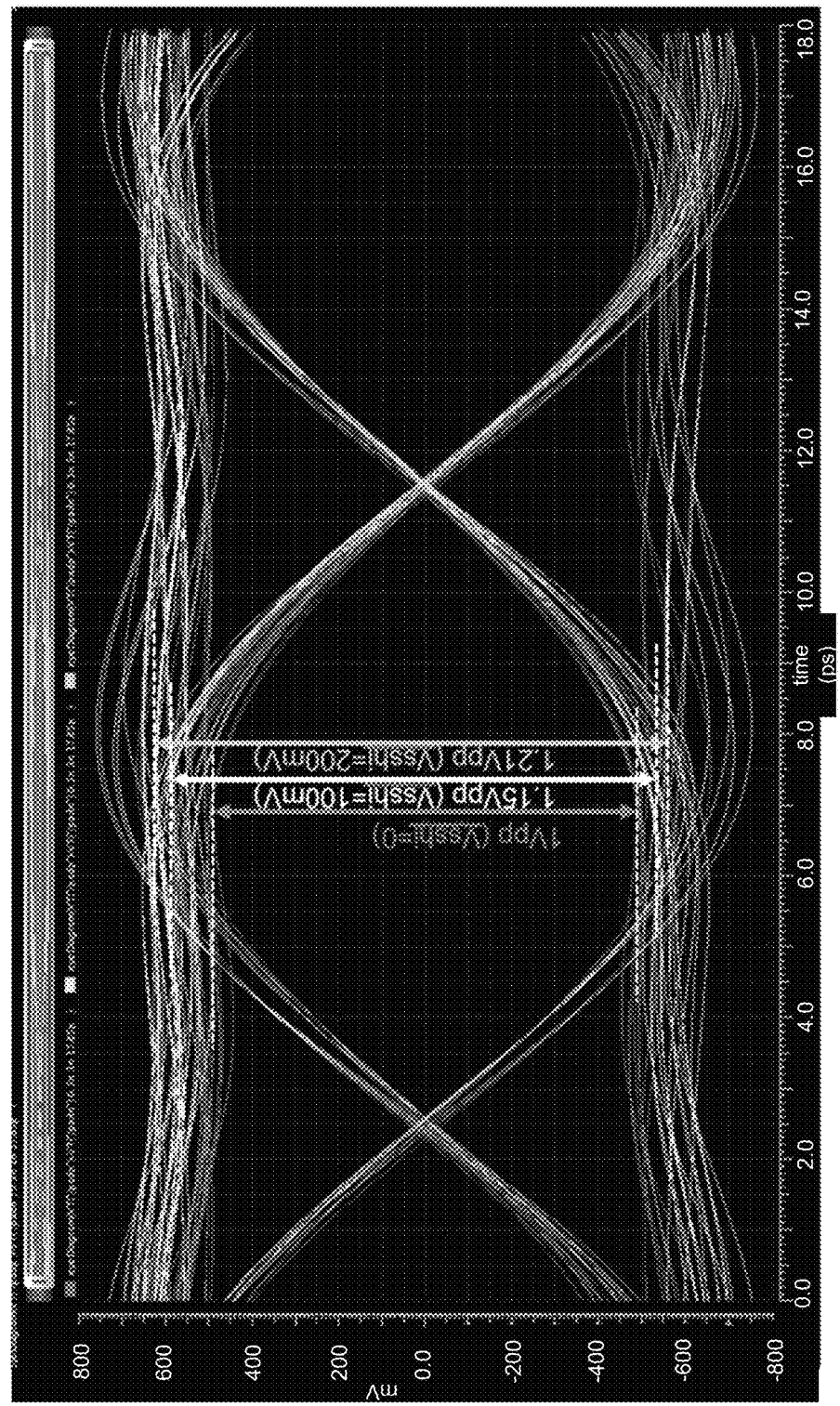
FIG. 12 illustrate simulated driver output eye diagrams and for different VSSHI levels, respectively, in accordance with some embodiments.

FIG. 12 illustrates simulated driver output eye diagram 1200, in accordance with some embodiments. Increasing VSSHI improves the eye opening, improving timing and sampling margins.

Figure 13:
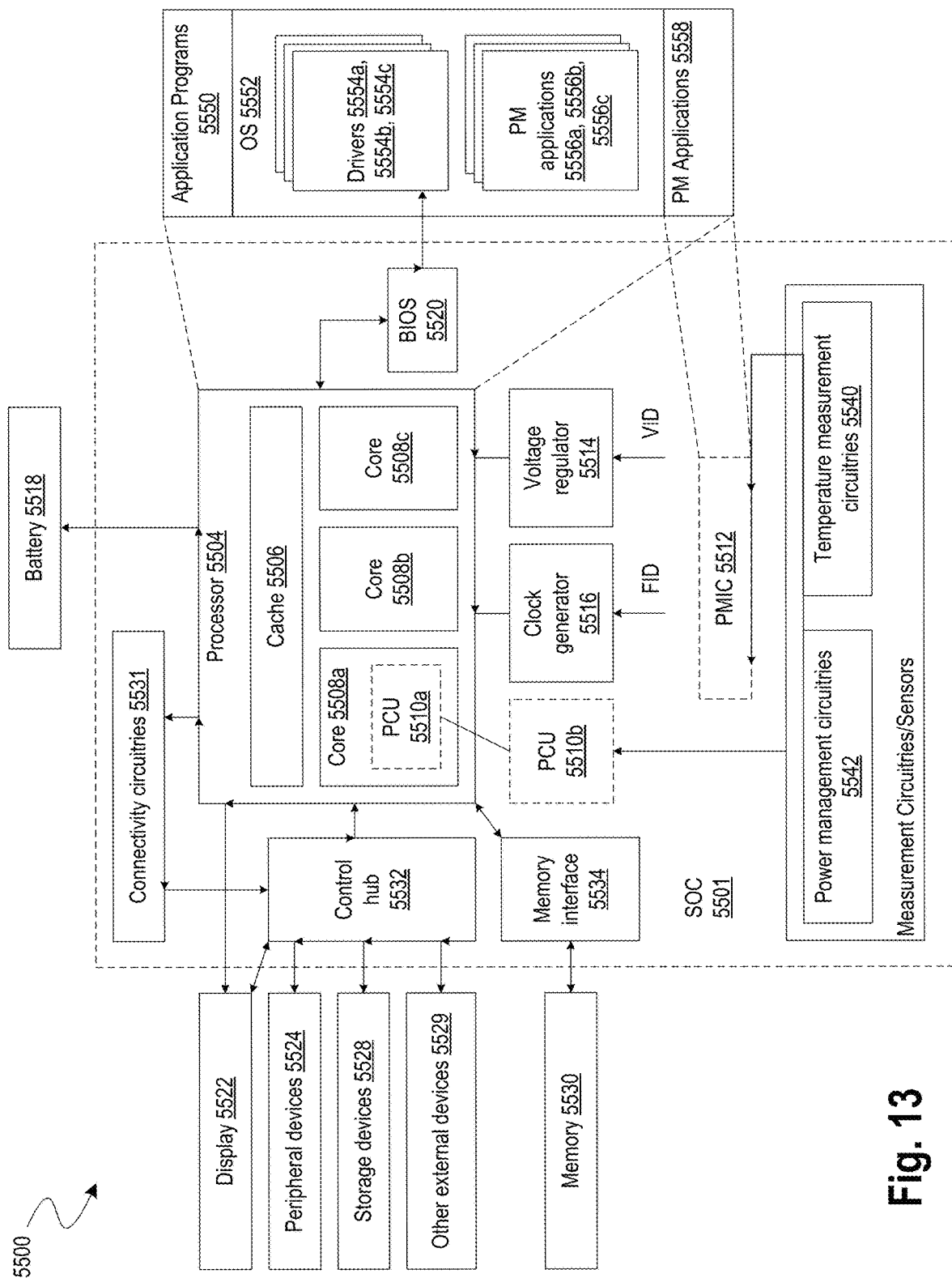
FIG. 13 illustrates a smart device or a computer system or a SoC (System-on-Chip) time-interleaved 4-way data serializing transmitter front-end using active inductor with gate-resistor peaked n-type load in a serializer, Bessel-like LC filter, and/or pulse width tuning, in accordance with some embodiments.

FIG. 13 illustrates a smart device or a computer system or a SoC (System-on-Chip) time-interleaved 4-way data serializing transmitter front-end using active inductor with gate-resistor peaked n-type load in a serializer, $9^{th}$ order Bessel-like LC filter, and/or pulse width tuning, in accordance with some embodiments. It is pointed out that those elements of FIG. 13 having the same reference numbers (or names) as the elements of any other figure may operate or function in any manner similar to that described, but are not limited to such.

In some embodiments, device 5500 represents an appropriate computing device, such as a computing tablet, a mobile phone or smart-phone, a laptop, a desktop, an Internet-of-Things (TOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 13, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing means. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 13, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508a, 5508b, 5508c, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510a/b and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, VR 5514 includes a controlled current source or a parallel current source (PCS) to assist a DC-DC buck converter and to alleviate the stress on the C4 bumps while boosting the efficiency of the DC-DC converter at the high-load current scenarios. The PSC adds current to the output power supply rail, which is coupled to a load. In some embodiments, the PCS is activated to mitigate droop events due to high di/dt events on the output power supply rail. The PCS provides charge directly to the load (driving in parallel to the DC-DC converter) whenever the current supplied by the DC-DC converter is above a certain threshold level.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510a. In an example, some other sections of PCU 5510 may be implemented outside the processing cores 5508, and these sections of PCU 5510 are symbolically illustrated using a dotted box and labelled as PCU 5510b. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package. Other technical effects will be evident from the various figures and embodiments.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporarily increase the power draw for that core or processor 5504 (e.g., by increasing clock frequency and/or power supply voltage level) so that the core or processor 5504 can perform at higher performance level. As such, voltage and/or frequency can be increased temporally for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556*a*, 5556*b*, 5556*c*. The OS 5552 may also include various drivers 5554*a*, 5554*b*, 5554*c*, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 5510*a/b* has a capability to enable extra compute and telemetries resources for the runtime support of the pCode. Here pCode refers to a firmware executed by PCU 5510*a/b* to manage performance of the SoC 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the Psoc,pk SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc, th) based on the available battery power (which changes slowly) and set the SoC throttling peak power (Psoc, th). In some embodiments, pCode decides the frequencies and voltages based on Psoc, th. In this case, throttling events have less negative effect on the SoC performance. Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

In some embodiments, the processor includes a fully-unrolled SHA256 datapath featuring a latch-based pipeline design clocked by 3-phase non-overlapping clocks. A scheme to improve throughput (performance) by modulating the clock duty cycle in a deterministic way to reduce the dead time in the latch-based pipeline design to a minimum that is needed in silicon. This DLL in a clock path is used to generate a non-50% duty cycle clock. The extra high phase of the clock increases the time the latch is transparent. With the introduction of the DLL the dead time is kept to just the time a particular part needs to satisfy hold time requirements. Another scheme is described to reduce glitch power where a circuit element (e.g., latch) is introduced to act as a glitch gate. The latch prevents the early toggling signals from propagating. It is timed such that the logic that gets resolved the last passes through the latch.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core.

Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies.

Here, the term "interconnect" refers to a communication link, or channel, between two or more points or nodes. It may comprise one or more separate conduction paths such as wires, vias, waveguides, passive components, and/or active components. It may also comprise a fabric.

Here the term "interface" generally refers to software and/or hardware used to communicate with an interconnect. An interface may include logic and I/O driver/receiver to send and receive data over the interconnect or one or more wires.

Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a pulse generator; a first transistor coupled to the pulse generator, wherein an output of the pulse generator controls a gate terminal of the first transistor; and a second transistor coupled is series with the first transistor via a node, wherein a gate terminal of the second transistor is controllable by a resistive device.

Example 2: The apparatus of example 1, wherein the pulse generator receives a data input, a first clock and a second clock, wherein the first clock is phase shifted relative to the second clock by substantially 90 degrees.

Example 3: The apparatus of example 2, wherein a voltage on a ground node of the pulse generator is tunable via a circuitry.

Example 4: The apparatus of example 3, wherein the circuitry comprises: a controller to compare a voltage on the ground node with a reference voltage to generate a digital code; a plurality of switches controllable by the digital code; and a capacitor coupled to the ground node.

Example 5: The apparatus of example 1 comprises: a third transistor having a gate terminal coupled to the node; and a fourth transistor coupled is series with the third transistor, wherein the fourth transistor is controllable by a bias.

Example 6: The apparatus of example 5 comprises a shunt inductor coupled to the third transistor, wherein the shunt inductor is coupled to a supply rail via a resistor.

Example 7: The apparatus of example 5 comprises a distributed network of inductors and ESD, wherein one end of the distributed network is coupled to the third transistor while another end of the distributed network is coupled to a package.

Example 8: The apparatus of example 1, wherein the resistive device comprises a transistor coupled to the gate of the second transistor, wherein the resistive device receives a bias voltage.

Example 9: An apparatus comprising: a quadrature clock generator; four pulse generators, wherein each pulse generator is to receive a pair of clocks from the quadrature clock generator and a data input; four first transistors, wherein each of the four first transistors is coupled to a pulse generator from among the four pulse generators, and a second transistor coupled is series with each of the four first transistors via a node, wherein a gate terminal of the second transistor is controllable by a resistive device.

Example 10: The apparatus of example 9, wherein a voltage on a ground node of the four pulse generators is tunable via a circuitry.

Example 11: The apparatus of example 10, wherein the circuitry comprises: a controller to compare a voltage on the ground node with a reference voltage to generate a digital code; a plurality of switches controllable by the digital code; and a capacitor coupled to the ground node.

Example 12: The apparatus of example 9 comprises: a third transistor having a gate terminal coupled to the node; and a fourth transistor coupled in series with the third transistor, wherein the fourth transistor is controllable by a bias.

Example 13: The apparatus of example 12 comprises a shunt inductor coupled to the third transistor, wherein the shunt inductor is coupled to a supply rail via a resistor.

Example 14: The apparatus of example 13 comprises a distributed network of inductors and ESD, wherein one end of the distributed network is coupled to the third transistor while another end of the distributed network is coupled to a package.

Example 15: The apparatus of example 9, wherein the resistive device comprises a transistor coupled to the gate terminal of the second transistor, wherein the resistive device receives a bias voltage.

Example 16: A system comprising: a memory; a processor circuitry coupled to the memory, wherein the processor circuitry is to execute one or more instructions; a wireless interface to allow the processor circuitry to communicate with another device, wherein the processor circuitry includes a serial-deserializer digital-to-analog converter, which comprises: a pulse generator; a first transistor coupled to the pulse generator, wherein an output of the pulse generator controls a gate terminal of the first transistor; and a second transistor coupled is series with the first transistor via a node, wherein a gate terminal of the second transistor is controllable by a resistive device.

Example 17: The system of example 16, wherein the pulse generator receives a data input, a first clock and a second clock, wherein the first clock is phase shifted relative to the second clock by substantially 90 degrees.

Example 18: The system of example 17, wherein a voltage on a ground node of the pulse generator is tunable via a circuitry.

Example 19: The system of example 16, wherein the resistive device comprises a transistor coupled to the gate terminal of the second transistor, wherein the resistive device receives a bias voltage.

Example 20: The system of example 19, wherein the transistor comprises a p-type transistor.

Example 21: An apparatus comprising: a pulse generator a virtual or AC ground node; and a circuitry to adjust a voltage on the virtual or AC ground node relative to a ground voltage.

Example 22: The apparatus of example 21, wherein the pulse generator comprises: a first n-type transistor coupled to the virtual or AC ground node, wherein the first n-type transistor controllable by a first clock; a second n-type transistor coupled to the virtual or AC ground node and an output of the pulse generator, wherein the second n-type transistor is controllable by a second clock, wherein the second clock has a phase which is shifted by 90 degrees relative to a phase of the first clock; and a third n-type transistor coupled to the virtual or AC ground node and the output, wherein the third n-type transistor is controllable by the first clock.

Example 23: The apparatus of example 22, wherein the pulse generator comprises: a first p-type transistor coupled in series with the first n-type transistor, wherein the first p-type transistor is controllable by the first clock; and a second p-type transistor coupled in series with the first p-type transistor, wherein the second p-type transistor is controllable by a data input.

Example 24: The apparatus of example 23, wherein the pulse generator comprises: a third p-type transistor coupled to drain terminals of the first n-type transistor and the first p-type transistor, wherein the third p-type transistor is controllable by the second clock, and wherein the third p-type transistor is coupled to the output.

Example 25: The apparatus of example 21, wherein the circuitry comprises: a controller coupled to the virtual or AC ground node; and a resistor switch coupled to an output of the controller and to the virtual or AC ground node.

Example 26: The apparatus of example 25, wherein the controller comprises: a comparator to compare voltage of the virtual or AC ground node with a reference voltage; and a shift-register coupled to an output of the comparator, wherein the shift-register is to adjust a resistance of the resistor switch, and thus the voltage on of the virtual or AC ground node.

Example 27: The apparatus of example 25, wherein the resistor switch comprises a plurality of transistors coupled in parallel between the virtual or AC ground node and a ground node.

Example 28: An apparatus comprising: a first inductor; a second inductor coupled in series with the first inductor; a first electrostatic discharge (ESD) circuit coupled to the first inductor and the second inductor; a third inductor coupled in series with the second inductor; and a second ESD circuit coupled to the second inductor and the third inductor.

Example 29: The apparatus of example 28, wherein the third inductor is coupled to a package.

Example 30: The apparatus of example 28, wherein the first inductor is coupled to a time-interleaved 4-way data serializing transmitter front-end circuit.

Example 31: The apparatus of example 30, wherein the time-interleaved 4-way data serializing transmitter front-end circuit comprises: a pulse generator; a first transistor coupled to the pulse generator, wherein an output of the pulse generator controls a gate terminal of the first transistor; and a second transistor coupled is series with the first transistor via a node, wherein a gate terminal of the second transistor is controllable by a resistive device.

Example 32: The apparatus of example 31, wherein the pulse generator receives a data input, a first clock and a second clock, wherein the first clock is phase shifted relative to the second clock by substantially 90 degrees.

Example 33: The apparatus of example 32, wherein a voltage on a ground node of the pulse generator is tunable via a circuitry.

Example 34: The apparatus of example 33, wherein the circuitry comprises: a controller to compare a voltage on the ground node with a reference voltage to generate a digital code; a plurality of switches controllable by the digital code; and a capacitor coupled to the ground node.

Example 35: The apparatus of example 31 comprises: a third transistor having a gate terminal coupled to the node; and a fourth transistor coupled is series with the third transistor, wherein the fourth transistor is controllable by a bias.

Example 36: The apparatus of example 35 comprises a shunt inductor coupled to the third transistor, wherein the shunt inductor is coupled to a supply rail via a resistor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a pulse generator;
   a first transistor coupled to the pulse generator, wherein an output of the pulse generator controls a gate terminal of the first transistor; and
   a second transistor coupled is series with the first transistor via a node, wherein a gate terminal of the second transistor is controllable by a resistive device;
   a third transistor having a gate terminal coupled to the node; and
   a fourth transistor coupled is series with the third transistor, wherein the fourth transistor is controllable by a bias.

2. The apparatus of claim 1, wherein the pulse generator receives a data input, a first clock and a second clock, wherein the first clock is phase shifted relative to the second clock by substantially 90 degrees.

3. The apparatus of claim 2, wherein a voltage on a ground node of the pulse generator is tunable via a circuitry.

4. The apparatus of claim 3, wherein the circuitry comprises:
   a controller to compare a voltage on the ground node with a reference voltage to generate a digital code;
   a plurality of switches controllable by the digital code; and
   a capacitor coupled to the ground node.

5. The apparatus of claim 1 comprises a shunt inductor coupled to the third transistor, wherein the shunt inductor is coupled to a supply rail via a resistor.

6. The apparatus of claim 1 comprises a distributed network of inductors and ESD, wherein one end of the distributed network is coupled to the third transistor while another end of the distributed network is coupled to a package.

7. The apparatus of claim 1, wherein the resistive device comprises a transistor coupled to the gate of the second transistor, wherein the resistive device receives a bias voltage.

8. An apparatus comprising:
a quadrature clock generator;
four pulse generators, wherein each pulse generator is to receive a pair of clocks from the quadrature clock generator and a data input;
four first transistors, wherein each of the four first transistors is coupled to a pulse generator from among the four pulse generators, and
a second transistor coupled is series with each of the four first transistors via a node, wherein a gate terminal of the second transistor is controllable by a resistive device.

9. The apparatus of claim 8, wherein a voltage on a ground node of the four pulse generators is tunable via a circuitry.

10. The apparatus of claim 9, wherein the circuitry comprises:
a controller to compare a voltage on the ground node with a reference voltage to generate a digital code;
a plurality of switches controllable by the digital code; and
a capacitor coupled to the ground node.

11. The apparatus of claim 8 comprises:
a third transistor having a gate terminal coupled to the node; and
a fourth transistor coupled in series with the third transistor, wherein the fourth transistor is controllable by a bias.

12. The apparatus of claim 11 comprises a shunt inductor coupled to the third transistor, wherein the shunt inductor is coupled to a supply rail via a resistor.

13. The apparatus of claim 12 comprises a distributed network of inductors and ESD, wherein one end of the distributed network is coupled to the third transistor while another end of the distributed network is coupled to a package.

14. The apparatus of claim 8, wherein the resistive device comprises a transistor coupled to the gate terminal of the second transistor, wherein the resistive device receives a bias voltage.

15. A system comprising:
a memory;
a processor circuitry coupled to the memory, wherein the processor circuitry is to execute one or more instructions; and
a wireless interface to allow the processor circuitry to communicate with another device, wherein the processor circuitry includes a serial-deserializer digital-to-analog converter, which comprises:
a pulse generator;
a first transistor coupled to the pulse generator, wherein an output of the pulse generator controls a gate terminal of the first transistor; and
a second transistor coupled is series with the first transistor via a node, wherein a gate terminal of the second transistor is controllable by a resistive device.

16. The system of claim 15, wherein the pulse generator receives a data input, a first clock and a second clock, wherein the first clock is phase shifted relative to the second clock by substantially 90 degrees.

17. The system of claim 16, wherein a voltage on a ground node of the pulse generator is tunable via a circuitry.

18. The system of claim 15, wherein the resistive device comprises a transistor coupled to the gate terminal of the second transistor, wherein the resistive device receives a bias voltage.

19. The system of claim 18, wherein the transistor comprises a p-type transistor.

* * * * *